US012642063B2

(12) United States Patent
Hsu et al.

(10) Patent No.: US 12,642,063 B2
(45) Date of Patent: *May 26, 2026

(54) SEMICONDUCTOR DEVICE INCLUDING ISOLATION STRUCTURE WITH IMPURITY AND METHOD FOR MANUFACTURING THE SAME

(71) Applicant: NANYA TECHNOLOGY CORPORATION, New Taipei City (TW)

(72) Inventors: Kuo-Chung Hsu, Kaohsiung City (TW); En-Jui Li, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 474 days.

This patent is subject to a terminal disclaimer.

(21) Appl. No.: 18/135,350

(22) Filed: Apr. 17, 2023

(65) Prior Publication Data

US 2024/0347375 A1     Oct. 17, 2024

(51) Int. Cl.
*H01L 21/762* (2006.01)
*H10W 10/00* (2026.01)
(Continued)

(52) U.S. Cl.
CPC ........ *H10W 10/014* (2026.01); *H10W 10/011* (2026.01); *H10W 10/0121* (2026.01);
(Continued)

(58) Field of Classification Search
CPC ............ H01L 21/762; H01L 21/76202; H01L 21/76205; H01L 21/76213; H01L 21/76216; H01L 21/76218; H01L 21/76221; H01L 21/76224; H01L 21/76237; H01L 21/76283; H01L 21/76291; H10D 62/112; H10D 62/113;
(Continued)

(56) References Cited

U.S. PATENT DOCUMENTS 7,902,037 B2 *   3/2011   Eun ................... H01L 21/76229
                                                        438/296
7,968,948 B2     6/2011   Eun
(Continued)

FOREIGN PATENT DOCUMENTS

TW         201324690 A       6/2013

OTHER PUBLICATIONS

Office Action and the search report mailed on Mar. 27, 2024 related to Taiwanese Application No. 112129541.
(Continued)

*Primary Examiner* — Kretelia Graham
*Assistant Examiner* — William Henry Anderson
(74) *Attorney, Agent, or Firm* — Xuan Zhang

(57) ABSTRACT

A semiconductor device and a method for manufacturing the same are provided. The semiconductor device includes a substrate having an active region and a shallow trench isolation (STI) adjacent to the active region of the substrate. The STI includes a charge trapping layer and a liner disposed between the charge trapping layer and the active region of the substrate, wherein the charge trapping layer is doped with an impurity.

8 Claims, 23 Drawing Sheets

(51) Int. Cl.

| | |
|---|---|
| *H10W 10/10* | (2026.01) |
| *H10W 10/13* | (2026.01) |
| *H10W 10/17* | (2026.01) |
| *H10B 10/00* | (2023.01) |
| *H10B 12/00* | (2023.01) |
| *H10B 20/25* | (2023.01) |

(52) U.S. Cl.

CPC ........... *H10W 10/10* (2026.01); *H10W 10/13* (2026.01); *H10W 10/17* (2026.01); *H10B 10/00* (2023.02); *H10B 12/00* (2023.02); *H10B 20/25* (2023.02)

(58) Field of Classification Search

CPC . H10D 62/115; H10D 62/116; H10P 90/1906; H10W 10/011; H10W 10/012; H10W 10/0121; H10W 10/0125; H10W 10/0126; H10W 10/0127; H10W 10/0128; H10W 10/014; H10W 10/0148; H10W 10/051; H10W 10/061; H10W 10/10; H10W 10/13; H10W 10/17; H10W 10/181; H10W 10/50

See application file for complete search history.

(56) References Cited

U.S. PATENT DOCUMENTS

| | | | |
|---|---|---|---|
| 11,848,339 B2 * | 12/2023 | Tsai | ...................... H10F 39/803 |
| 12,154,821 B2 * | 11/2024 | Chuang | ............. H10W 10/0143 |
| 2002/0031890 A1 | 3/2002 | Watanabe et al. | |
| 2005/0116312 A1 | 6/2005 | Lim et al. | |
| 2008/0166845 A1 * | 7/2008 | Darwish | ................ H10D 30/66 257/E21.345 |
| 2010/0072569 A1 * | 3/2010 | Han | .................. H10W 10/0143 257/296 |
| 2012/0056263 A1 | 3/2012 | Lee et al. | |
| 2014/0077294 A1 | 3/2014 | Hwang et al. | |
| 2015/0001669 A1 | 1/2015 | Chou et al. | |
| 2015/0115397 A1 | 4/2015 | Cheng et al. | |
| 2015/0279950 A1 | 10/2015 | Lee et al. | |
| 2020/0075730 A1 | 3/2020 | Lee et al. | |
| 2022/0059666 A1 | 2/2022 | Tsai | |
| 2022/0139764 A1 | 5/2022 | Hsu et al. | |
| 2022/0302190 A1 | 9/2022 | Tsai et al. | |
| 2023/0420499 A1 | 12/2023 | Chuang | |
| 2024/0347375 A1 | 10/2024 | Hsu et al. | |

OTHER PUBLICATIONS

Office Action and and the search report mailed on Dec. 10, 2025 related to U.S. Appl. No. 18/135,339.

* cited by examiner

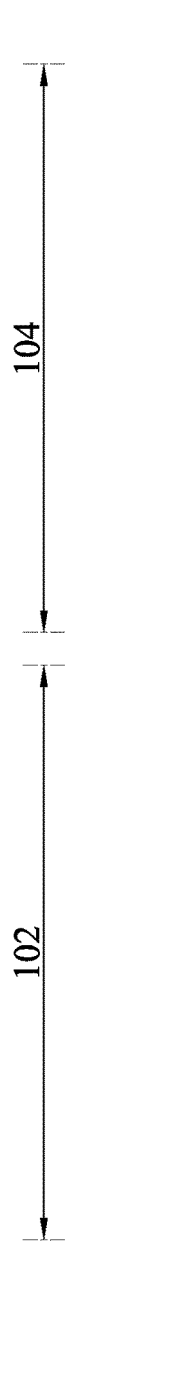
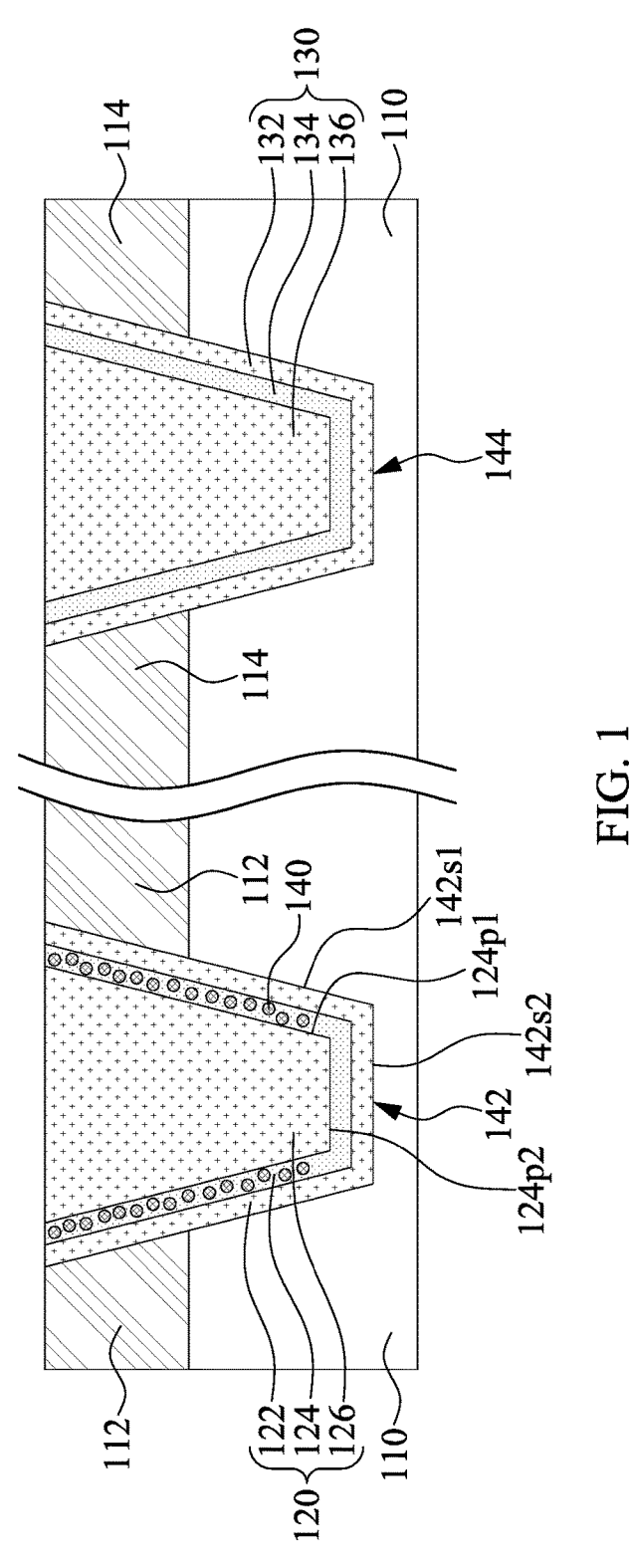
FIG. 1

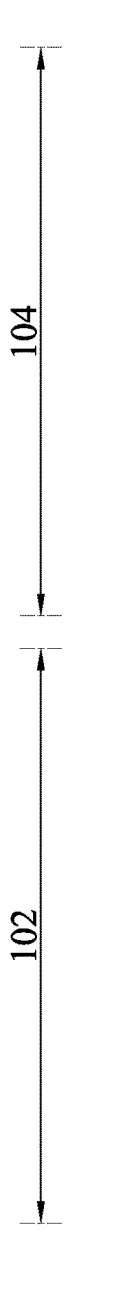
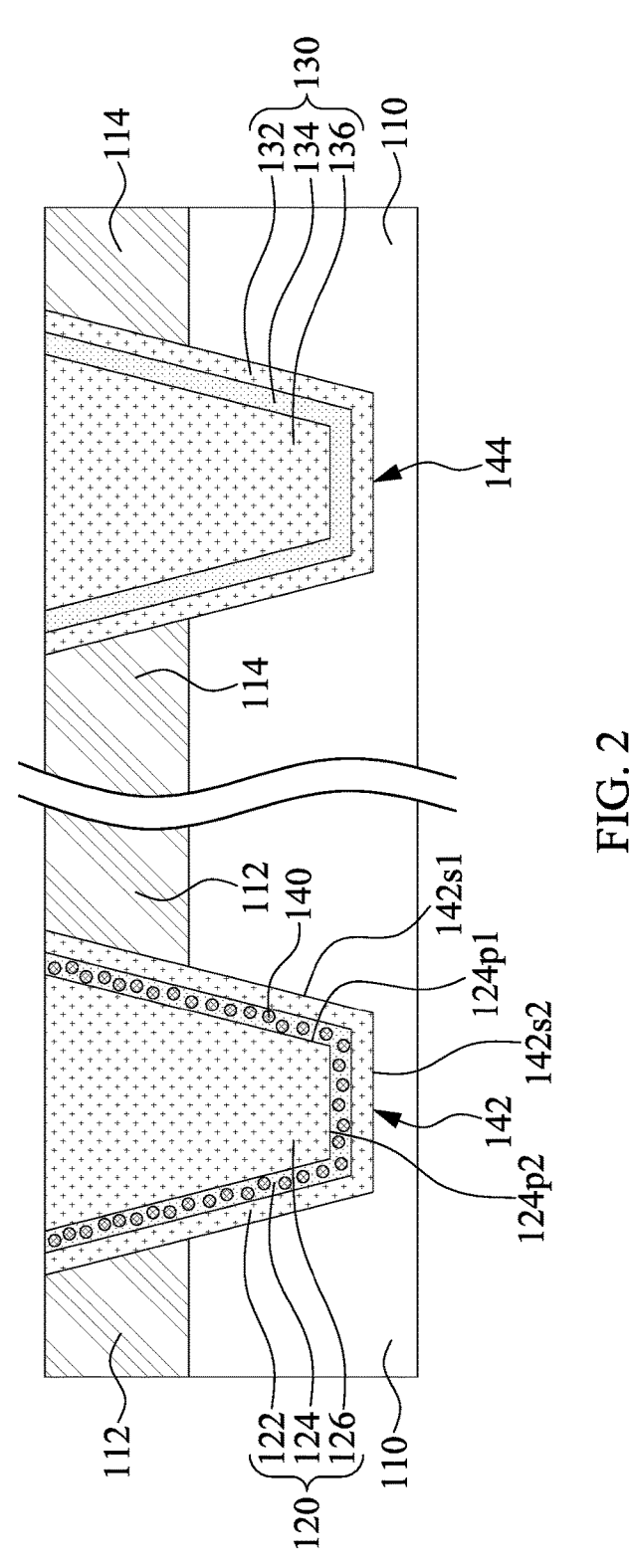
FIG. 2

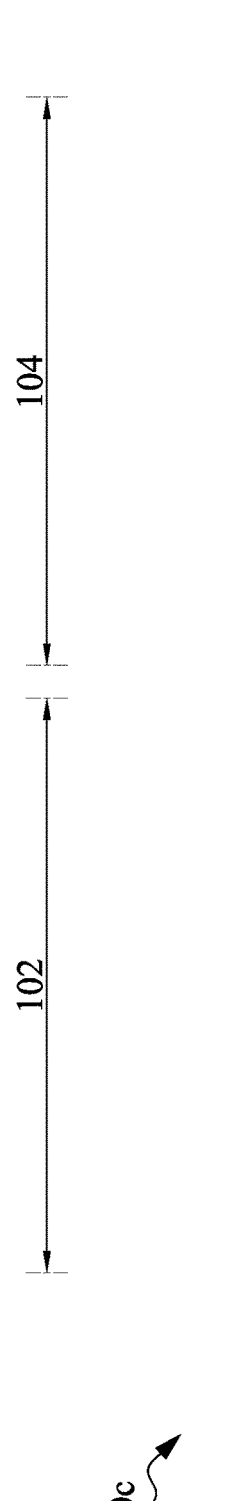
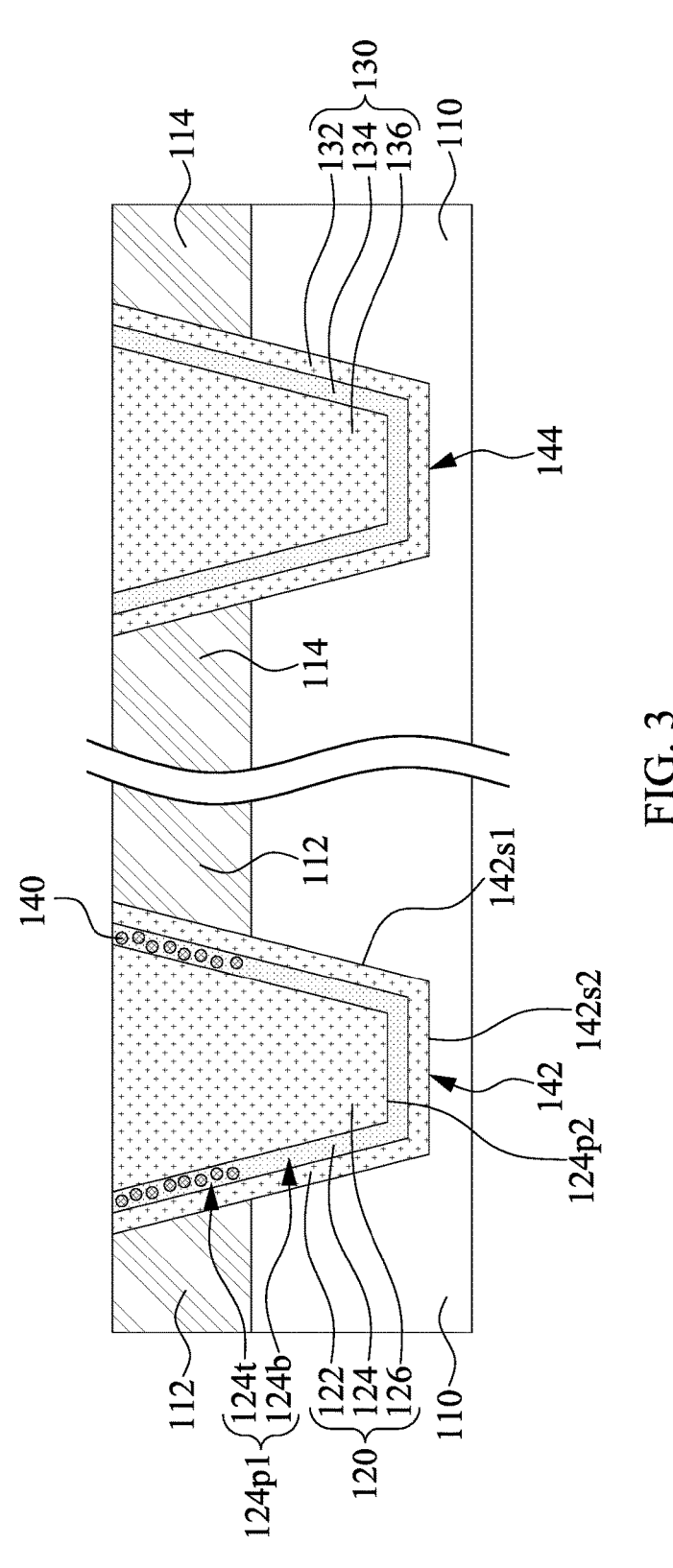
FIG. 3

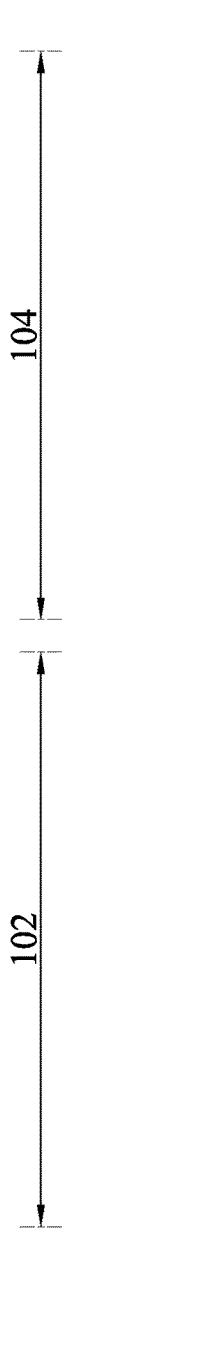
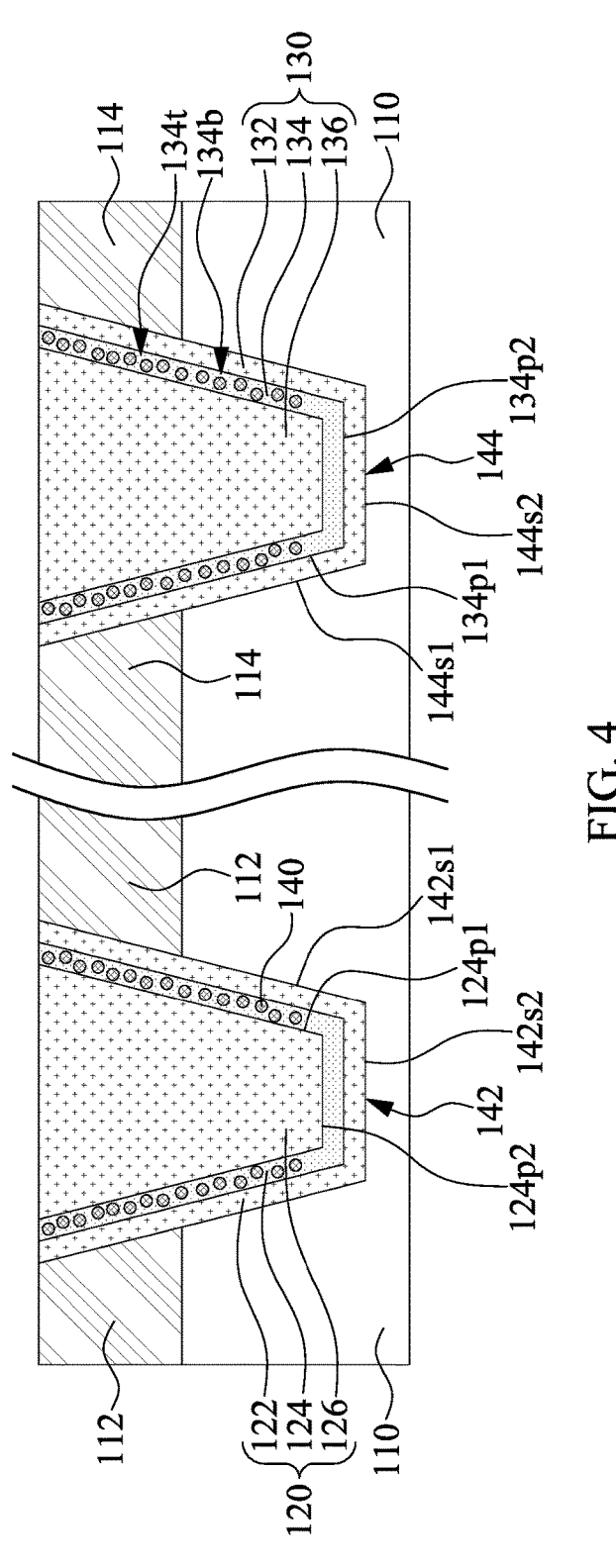
FIG. 4

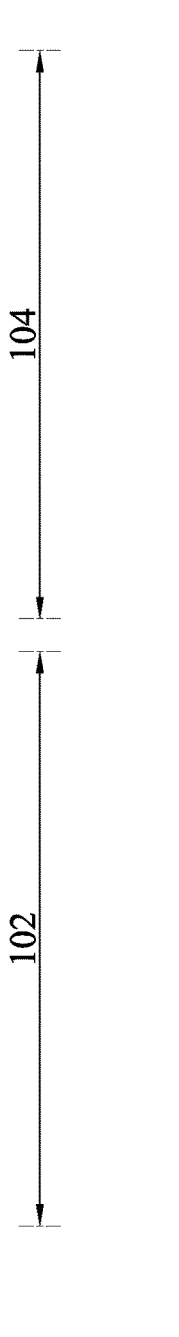
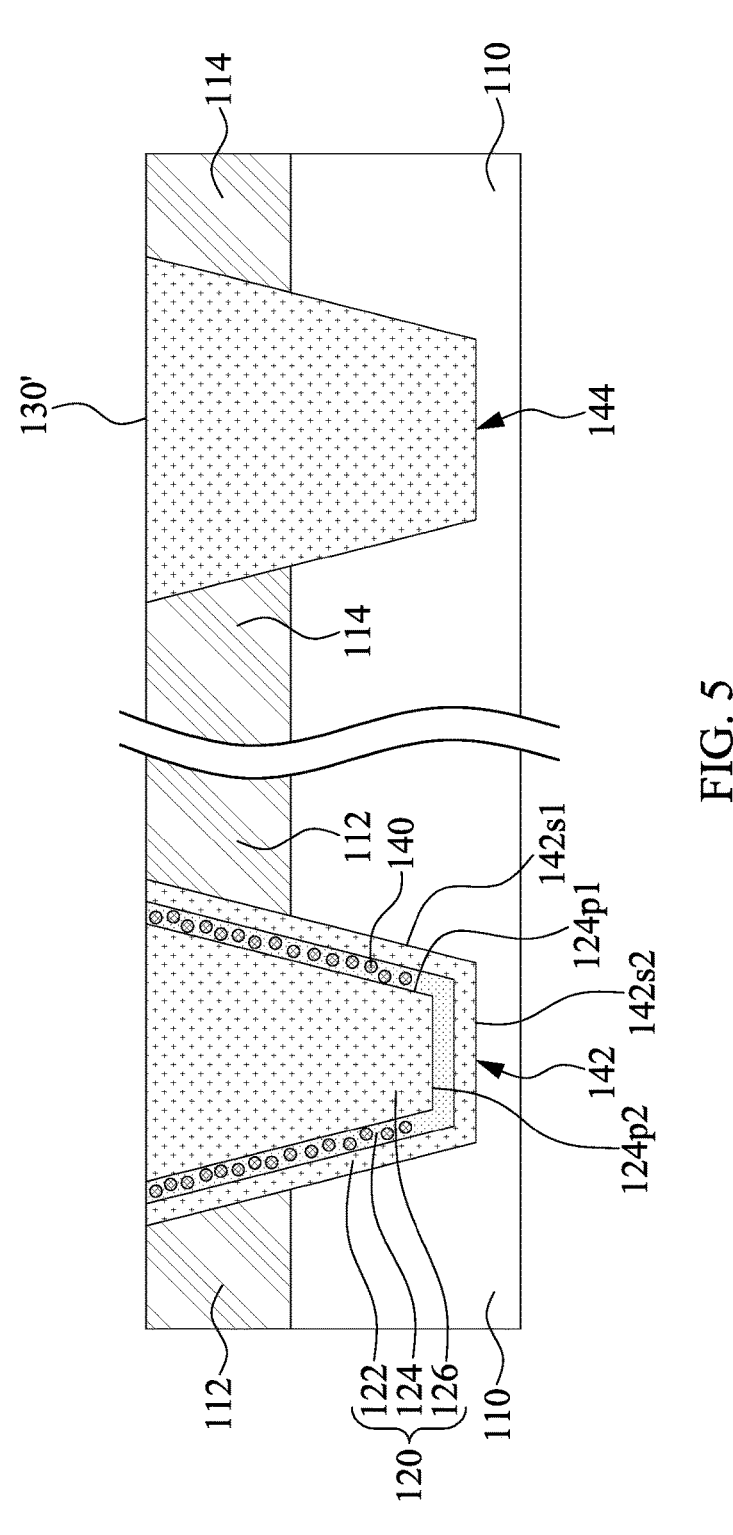
FIG. 5

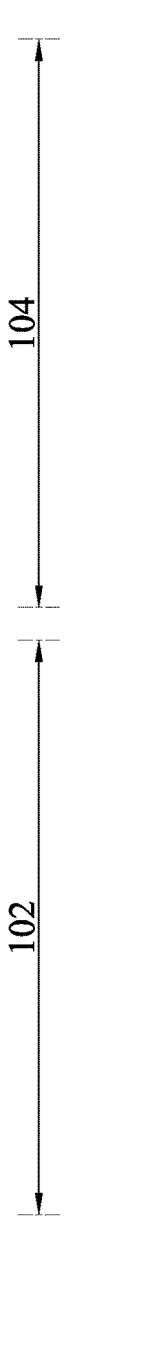
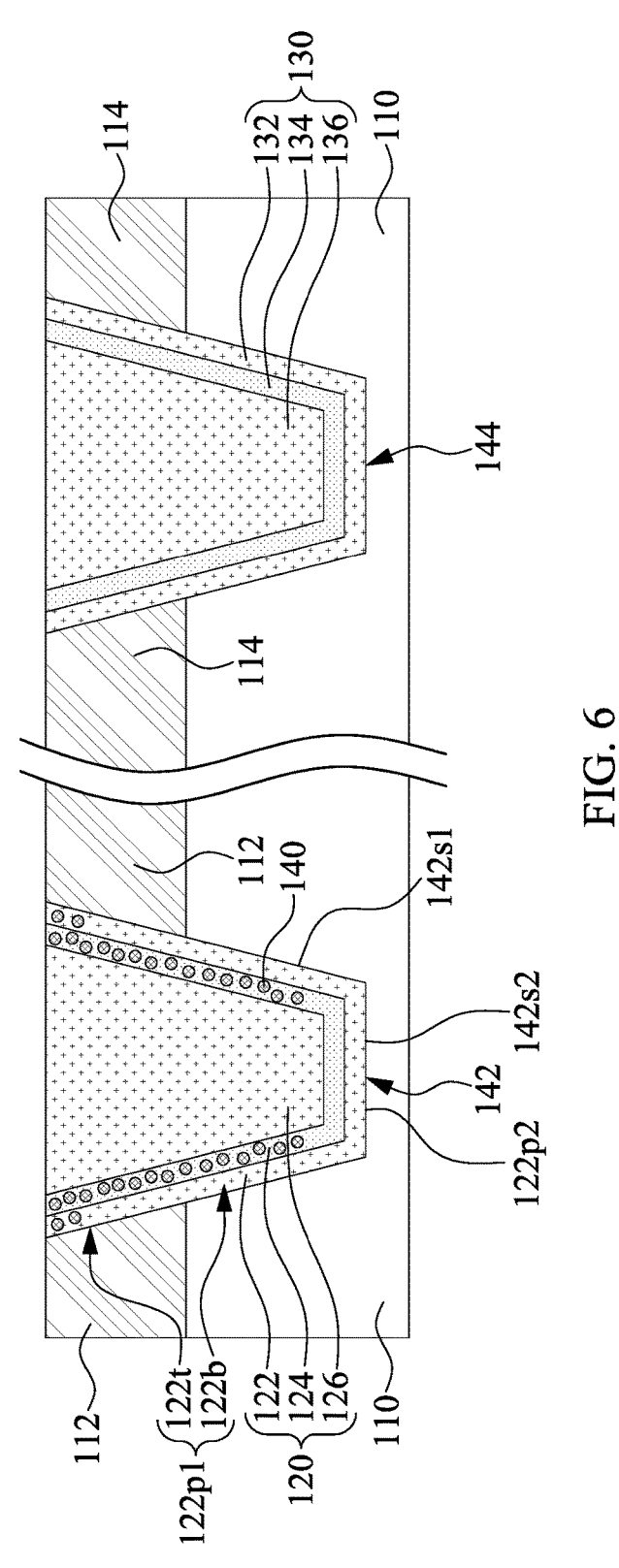
FIG. 6

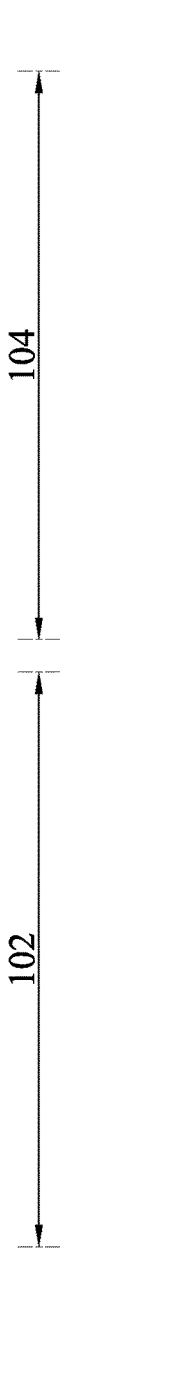
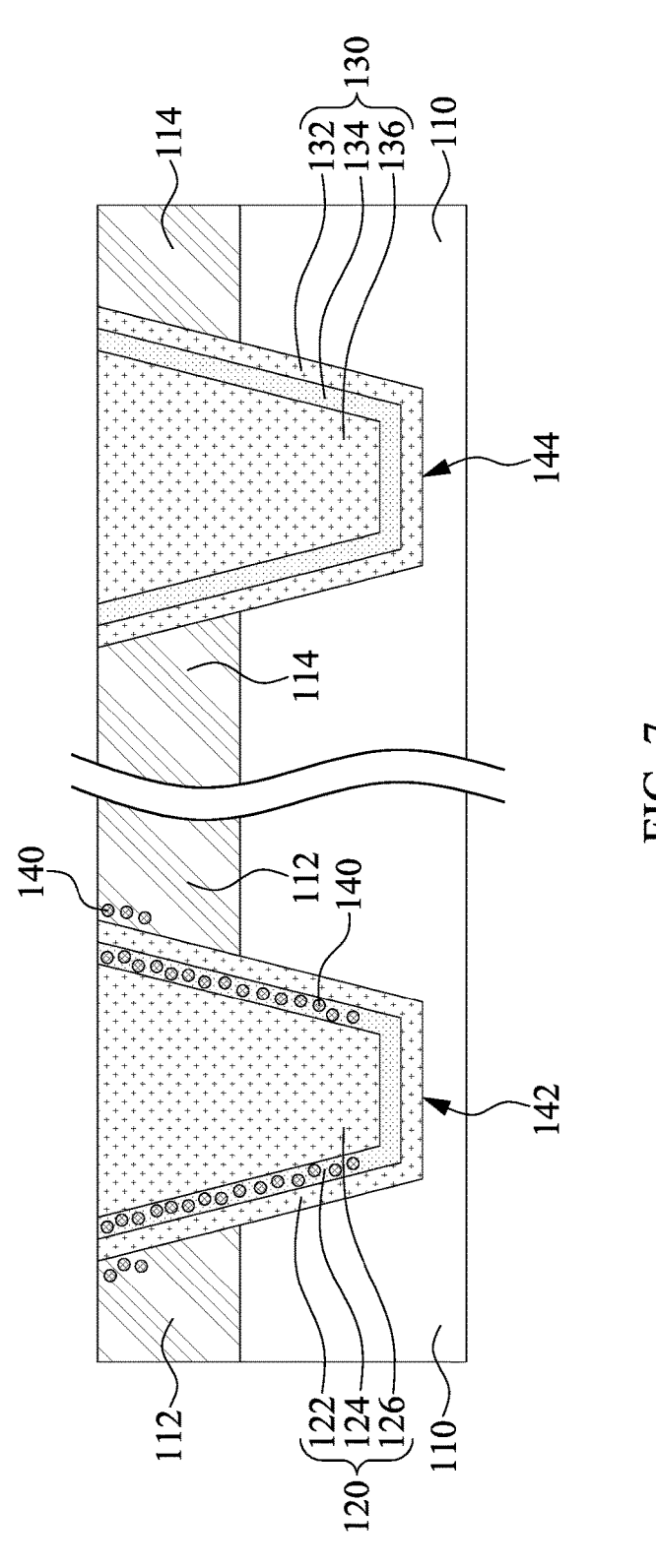
FIG. 7

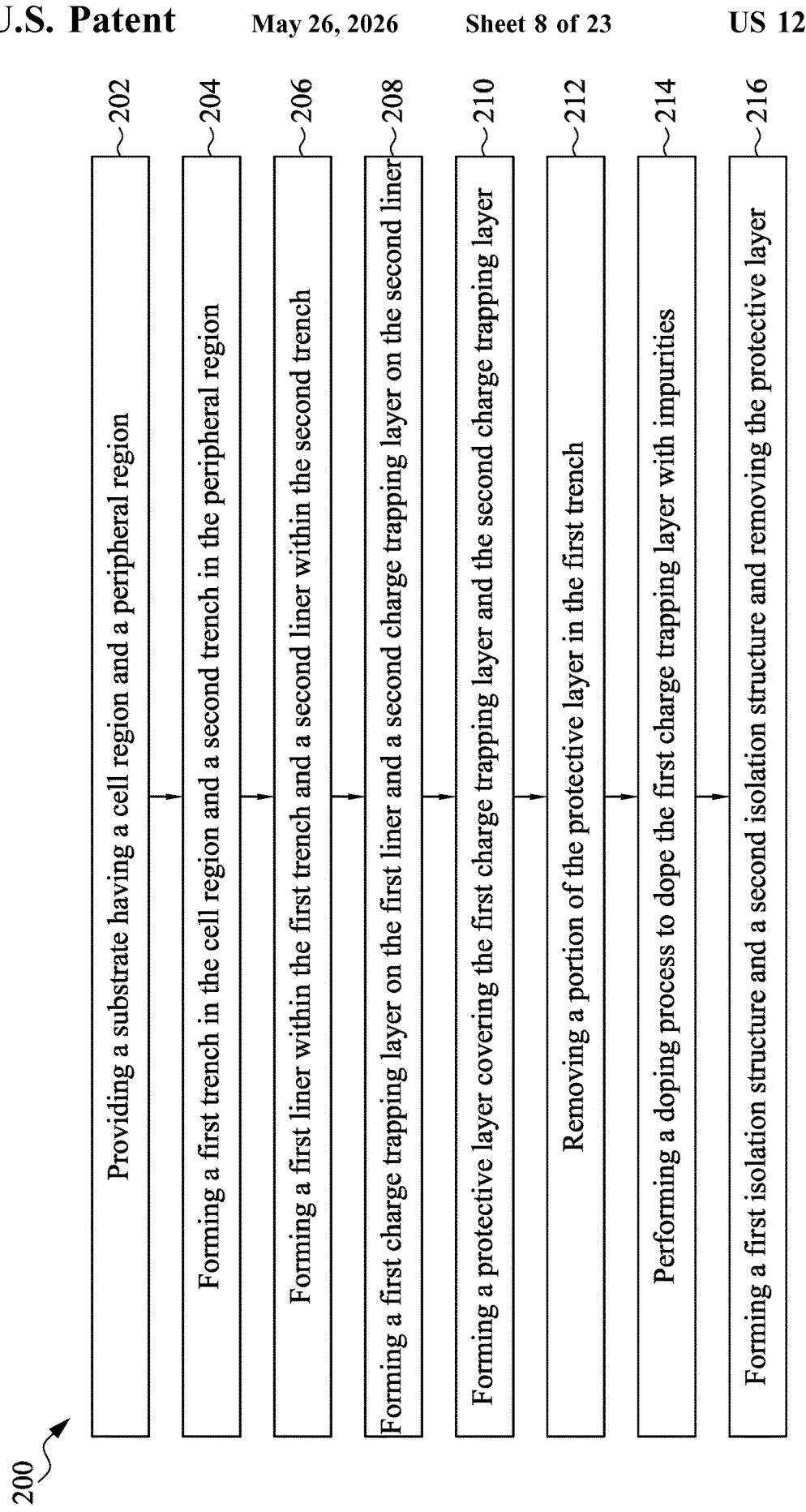

200

202  Providing a substrate having a cell region and a peripheral region

204  Forming a first trench in the cell region and a second trench in the peripheral region 206  Forming a first liner within the first trench and a second liner within the second trench 208  Forming a first charge trapping layer on the first liner and a second charge trapping layer on the second liner 210  Forming a protective layer covering the first charge trapping layer and the second charge trapping layer 212  Removing a portion of the protective layer in the first trench 214  Performing a doping process to dope the first charge trapping layer with impurities 216  Forming a first isolation structure and a second isolation structure and removing the protective layer

FIG. 8

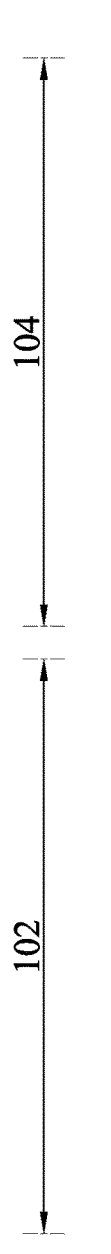
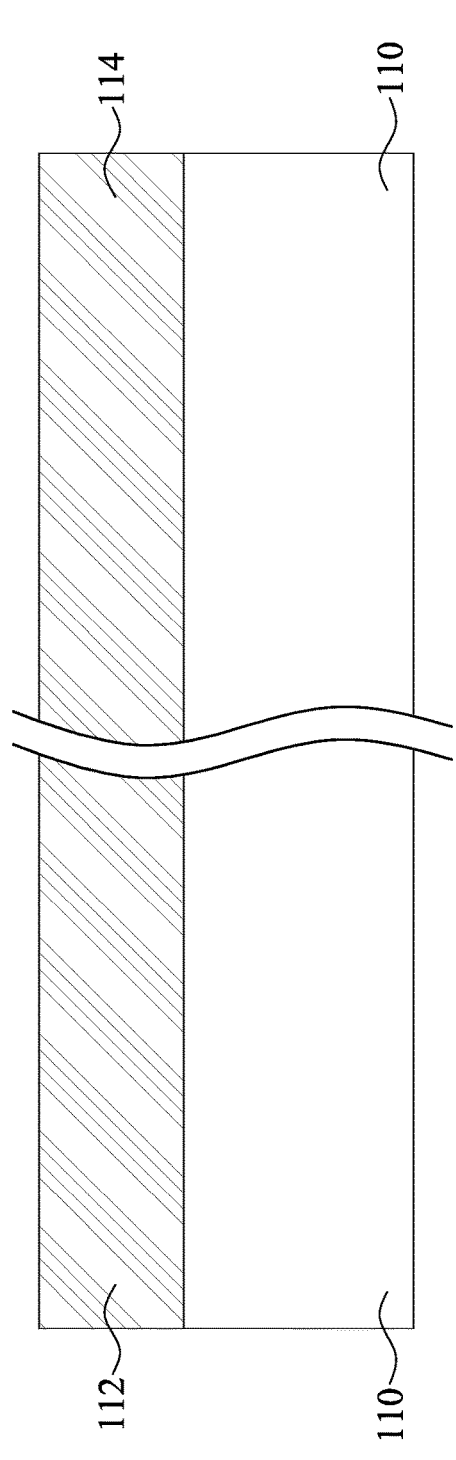
FIG. 9A

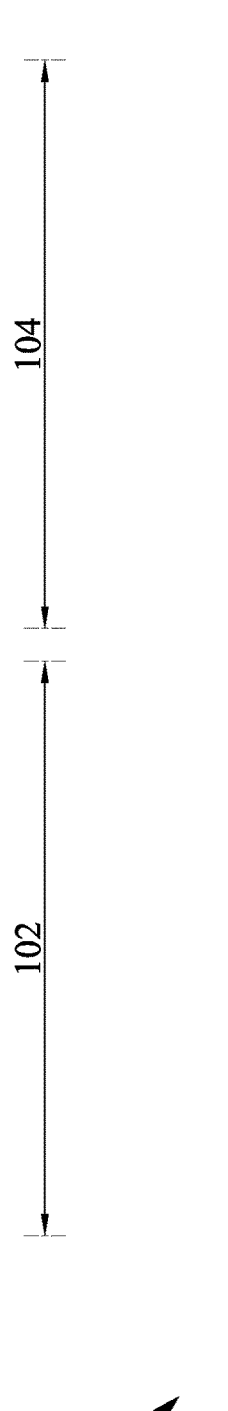
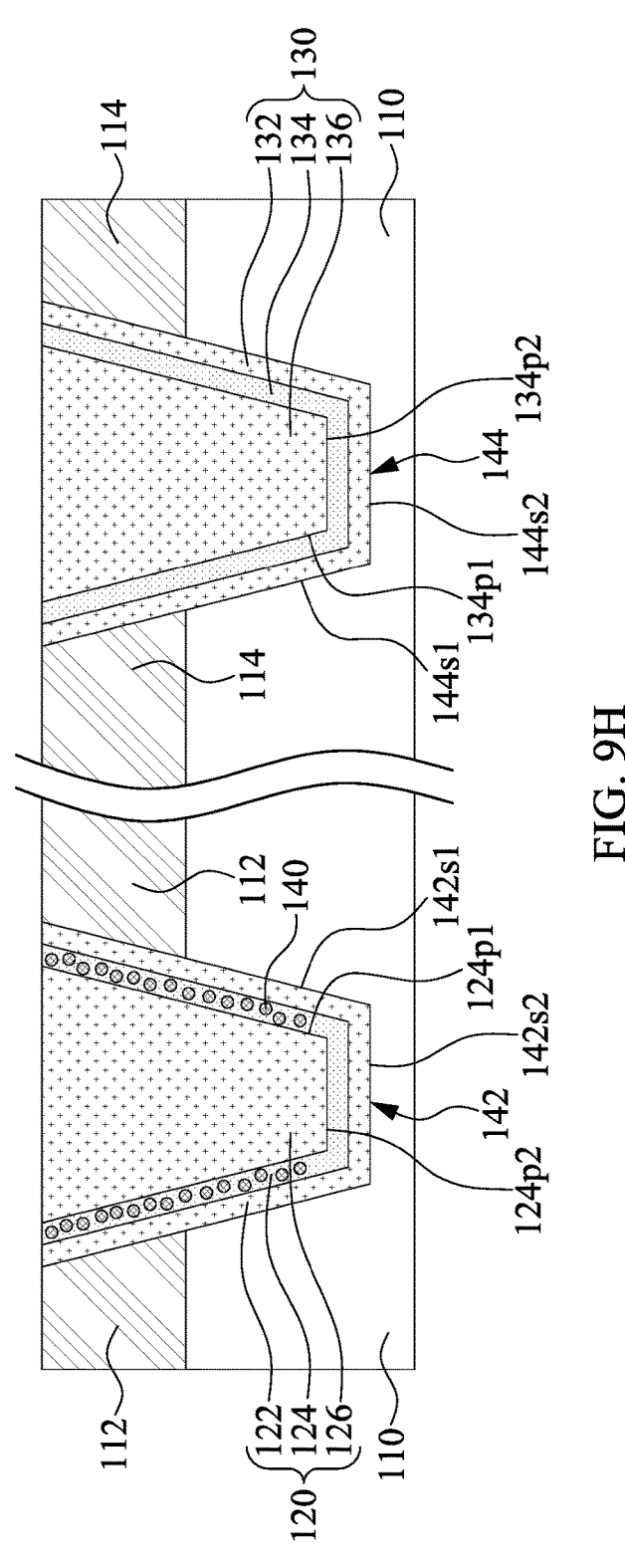
FIG. 9H

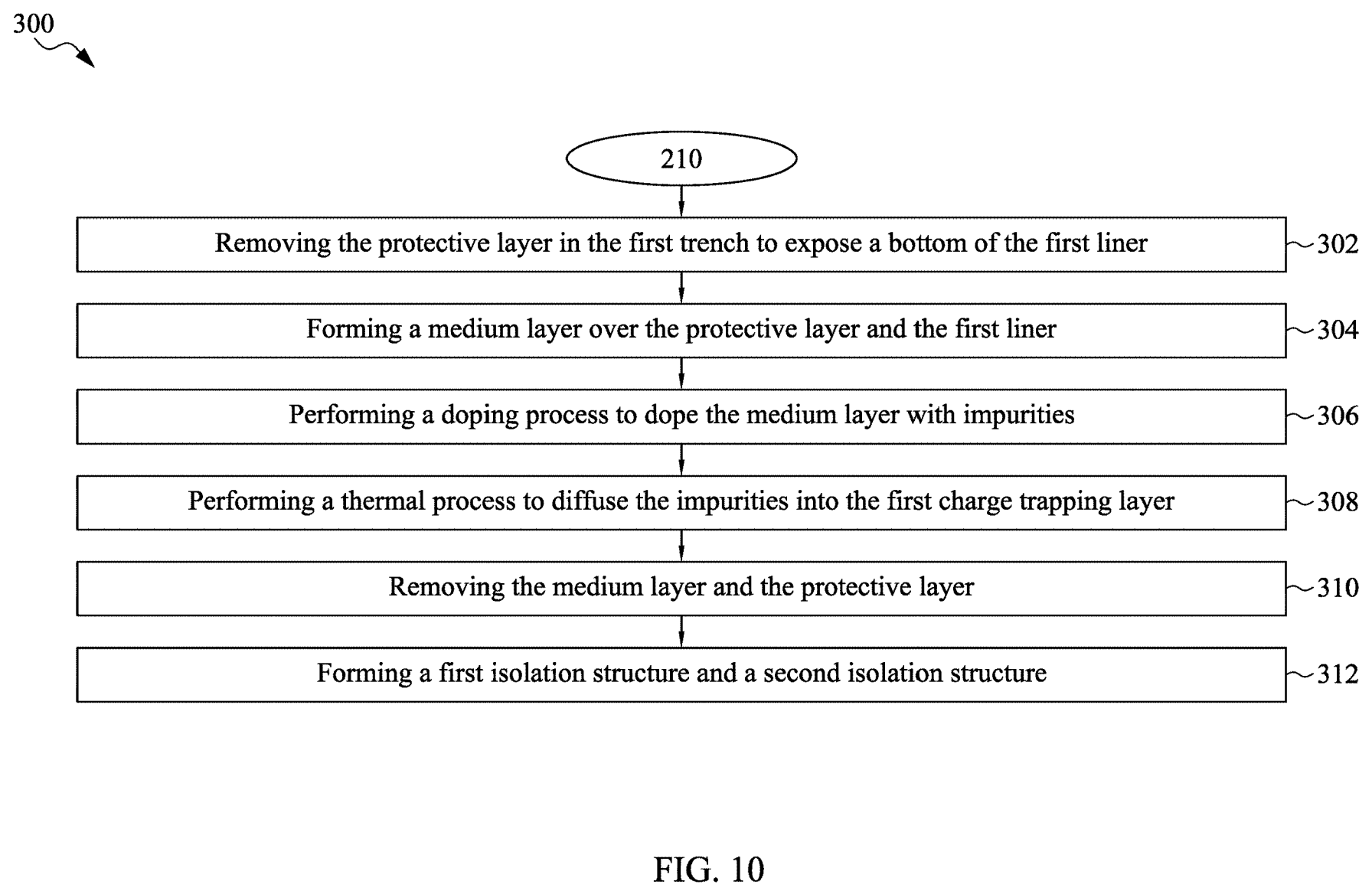

300

210

302 Removing the protective layer in the first trench to expose a bottom of the first liner 304 Forming a medium layer over the protective layer and the first liner 306 Performing a doping process to dope the medium layer with impurities 308 Performing a thermal process to diffuse the impurities into the first charge trapping layer 310 Removing the medium layer and the protective layer 312 Forming a first isolation structure and a second isolation structure

FIG. 10

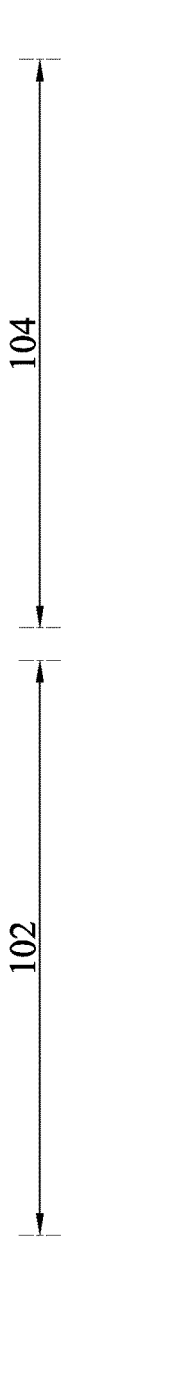
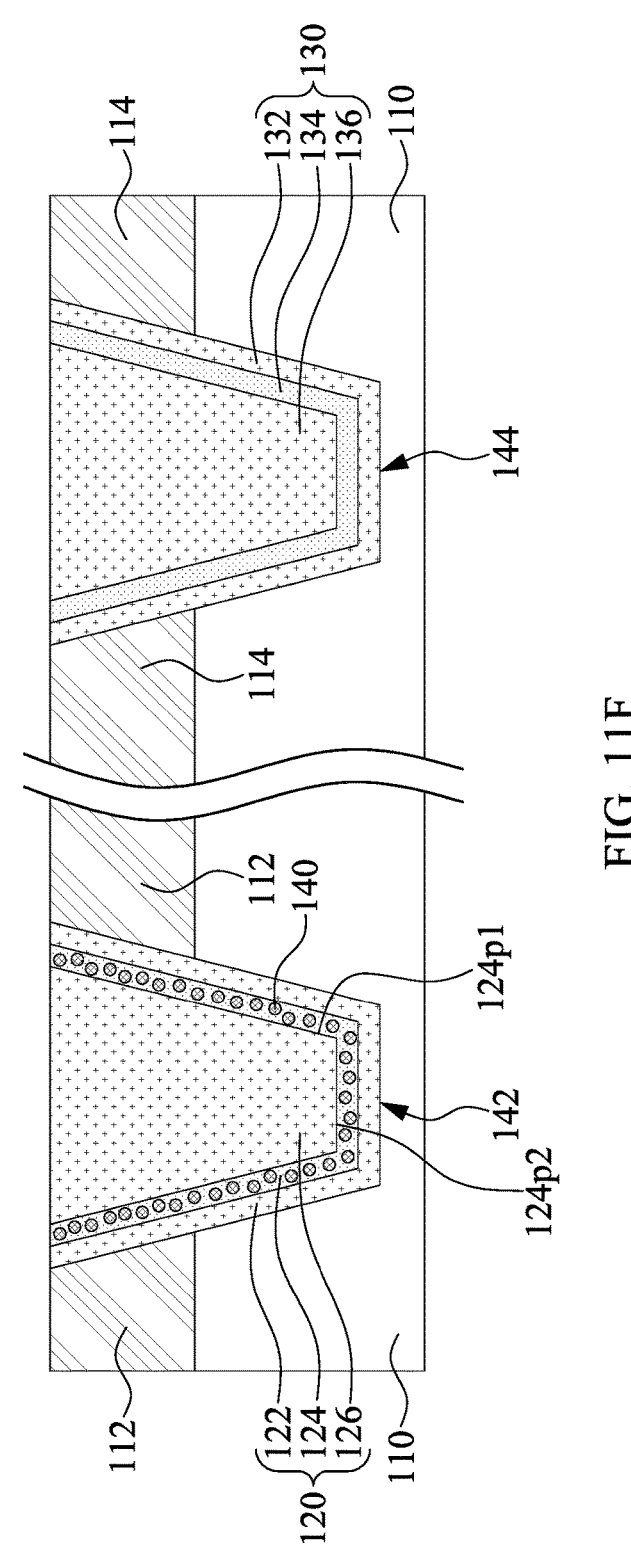
FIG. 11F

SEMICONDUCTOR DEVICE INCLUDING ISOLATION STRUCTURE WITH IMPURITY AND METHOD FOR MANUFACTURING THE SAME

TECHNICAL FIELD

The present disclosure relates to a semiconductor device and a method for manufacturing the same, and more particularly, to a semiconductor device including an isolation structure with impurities therein.

DISCUSSION OF THE BACKGROUND

A dynamic random access memory (DRAM) device is a type of random access memory that stores each bit of data in a separate capacitor within an integrated circuit. Typically, a DRAM is arranged in a square array of one capacitor and transistor per cell. A vertical transistor has been developed for the $4F^2$ DRAM cell, where F stands for the photolithographic minimum feature width or critical dimension (CD). However, recently, DRAM manufacturers have faced tremendous challenges in shrinking the memory cell area as the word line spacing continues to shrink. For example, a charge trapping layer in an isolation structure may trap charges and induce opposite charges in an active region of a substrate, resulting in leakage current.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device. The semiconductor device includes a substrate and a first isolation structure. The substrate has a cell region and a peripheral region. The first isolation structure is disposed in the cell region of the substrate. The first isolation structure includes a first dielectric layer and a second dielectric layer. The second dielectric layer is spaced apart from the substrate by the first dielectric layer. The second dielectric layer is doped with an impurity.

Another aspect of the present disclosure provides a semiconductor device. The semiconductor device includes a substrate and a shallow trench isolation (STI). The substrate has an active region. The STI is adjacent to the active region of the substrate. The STI includes a charge trapping layer and a liner. The liner is disposed between the charge trapping layer and the active region of the substrate. The charge trapping layer is doped with an impurity.

Another aspect of the present disclosure provides a method for manufacturing a semiconductor device. The method includes providing a substrate. The substrate includes a cell region and a peripheral region. The method also includes forming a first isolation structure in the cell region and a second isolation structure in the peripheral region. The method further includes doping the first isolation structure with an impurity.

The embodiments of the present disclosure disclose a semiconductor device including an isolation structure. The isolation structure can include a charge trapping layer, such as silicon nitride. The lone pair of electrons of silicon in silicon nitride may form a dangling bond, trapping charges (e.g., charges) and thus inducing hot-electron-induced punchthrough (HEIP) effect. In this embodiment, the charge trapping layer can be doped with impurities. The impurities can be utilized to terminate the dangling bond of the charge trapping layer, which thereby improves the HEIP effect.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the concept and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

FIG. 1 is a cross-sectional view of a semiconductor device, in accordance with some embodiments of the present disclosure.

FIG. 2 is a cross-sectional view of a semiconductor device, in accordance with some embodiments of the present disclosure.

FIG. 3 is a cross-sectional view of a semiconductor device, in accordance with some embodiments of the present disclosure.

FIG. 4 is a cross-sectional view of a semiconductor device, in accordance with some embodiments of the present disclosure.

FIG. 5 is a cross-sectional view of a semiconductor device, in accordance with some embodiments of the present disclosure.

FIG. 6 is a cross-sectional view of a semiconductor device, in accordance with some embodiments of the present disclosure.

FIG. 7 is a cross-sectional view of a semiconductor device, in accordance with some embodiments of the present disclosure.

FIG. 8 is a flowchart illustrating a method for manufacturing a semiconductor device, in accordance with various aspects of the present disclosure.

FIG. 9A illustrates various stages of manufacturing a semiconductor device, in accordance with some embodiments of the present disclosure.

FIG. 9H illustrates various stages of manufacturing a semiconductor device, in accordance with some embodiments of the present disclosure.

FIG. 10 is a flowchart illustrating a method for manufacturing a semiconductor device, in accordance with various aspects of the present disclosure.

FIG. 11F illustrates various stages of manufacturing a semiconductor device, in accordance with some embodiments of the present disclosure.

DETAILED DESCRIPTION

Figure 9B:
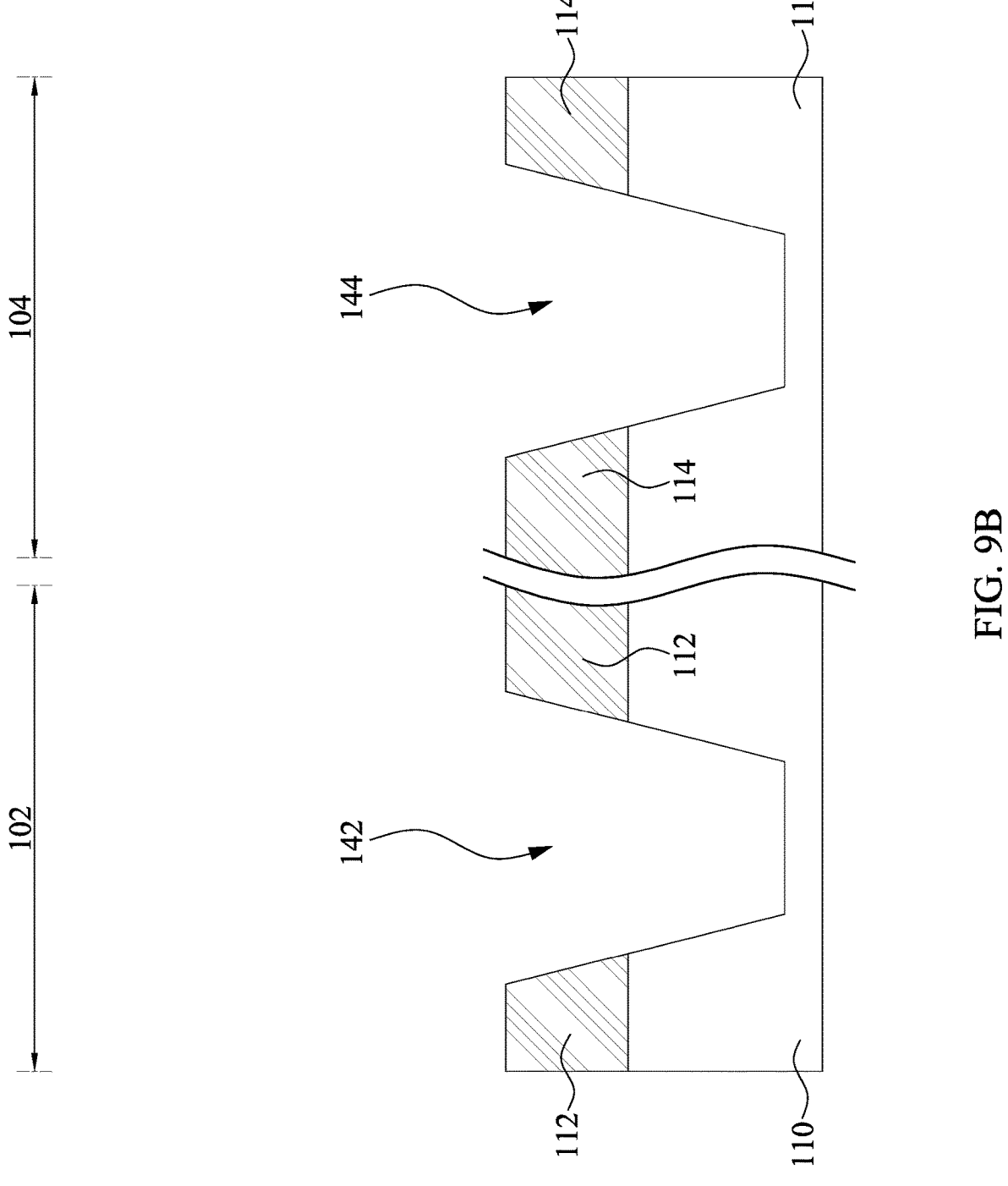
FIG. 9B illustrates various stages of manufacturing a semiconductor device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that a feature(s) of one embodiment applies to another embodiment, even if they share the same reference numeral.

It shall be understood that, although the terms "first," "second," "third," etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a cross-sectional view of a semiconductor device 100a, in accordance with some embodiments of the present disclosure.

In some embodiments, the semiconductor device 100a can include a cell region 102 and a peripheral region 104. In some embodiments, the cell region 102 can be a region in which a memory device is formed. The memory device can include, for example, a dynamic random access memory (DRAM) device, a one-time programming (OTP) memory device, a static random access memory (SRAM) device, or other suitable memory devices. In some embodiments, a DRAM can include, for example, a transistor, a capacitor, and other components. During a read operation, a word line can be asserted, turning on the transistor. The enabled transistor allows the voltage across the capacitor to be read by a sense amplifier through a bit line. During a write operation, the data to be written can be provided on the bit line when the word line is asserted.

The peripheral region 104 can be a region utilized to form a logic device (e.g., system-on-a-chip (SoC), central processing unit (CPU), graphics processing unit (GPU), application processor (AP), microcontroller, etc.), a radio frequency (RF) device, a sensor device, a micro-electro-mechanical-system (MEMS) device, a signal processing device (e.g., digital signal processing (DSP) device)), a front-end device (e.g., analog front-end (AFE) devices) or other devices.

The semiconductor device 100a can include a substrate 110. The substrate 110 may be a semiconductor substrate, such as a bulk semiconductor, a semiconductor-on-insulator (SOI) substrate, or the like. The substrate 110 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy. In some embodiments, the substrate 110 may have a multilayer structure, or the substrate 110 may include a multilayer compound semiconductor structure. In this disclosure, the substrate 110 can include a cell region and a peripheral region corresponding to the cell region 102 and the peripheral region 104 of the semiconductor device 100a.

As shown in FIG. 1, the cell region 102 can include an active region 112 and an isolation structure 120. In some embodiments, the active region 112 can include dopants, such as p type or n type dopants, doped therein. In some embodiments, the p type dopants can include boron (B), other group III elements, or any combination thereof. In some embodiments, the n type dopants can include arsenic (As), phosphorus (P), other group V elements, or any combination thereof.

The isolation structure 120 can be adjacent to the active region 112. In some embodiments, the isolation structure 120 can be a shallow isolation trench (STI), a local oxidation of silicon (LOCOS), a field oxidation region or structure (FOX), or other suitable isolation structures, or other suitable isolation structures. In some embodiments, the isolation structure 120 can include dielectric layers 122, 124, and 126.

In some embodiments, the dielectric layer 122 can be disposed within a trench 142 defined by the substrate 110. In some embodiments, the dielectric layer 122 can be the outmost layer of the isolation structure 120. In some embodiments, the dielectric layer 122 can be conformally disposed within the trench 142 defined by the substrate 110. In some embodiments, the dielectric layer 122 can be in contact with the substrate 110. In some embodiments, the dielectric layer 122 can include a relatively thin layer of silicon dioxide ($SiO_2$). The dielectric layer 122 can also be referred to as a "liner" in this disclosure.

In some embodiments, the dielectric layer 124 can be disposed within the trench 142 defined by the substrate 110. In some embodiments, the dielectric layer 124 can be conformally disposed on the dielectric layer 122. In some embodiments, the dielectric layer 124 can be spaced apart from the substrate 110 by the dielectric layer 122. In some embodiments, the dielectric layer 124 can be spaced apart from the active region 112 by the dielectric layer 122. In some embodiments, the dielectric layer 124 can include a charge trapping material. As used herein, the charge may refer to electron and/or hole charges. As used herein, the charge trapping material may refer to a material that can restrict the movement of a charge. In some embodiments, the dielectric layer 124 can include silicon nitride ($Si_3N_4$), oxynitride, carbon nitride, or other suitable materials. In some embodiments, the dielectric layer 124 can include a relatively thin layer of silicon nitride. The dielectric layer 124 can also be referred to as a "charge trapping layer" in this disclosure.

In some embodiments, the dielectric layer 126 can be disposed within the trench 142 defined by the substrate 110. In some embodiments, the dielectric layer 126 can be spaced apart from the dielectric layer 122 by the dielectric layer 124. In some embodiments, the dielectric layer 126 can include a relatively thick layer of silicon dioxide. The dielectric layer 126 can also be referred to as an "isolation layer" in this disclosure.

As shown in FIG. 1, the peripheral region 104 can include an active region 114 and an isolation structure 130. In some embodiments, the active region 114 can include dopants, such as p type or n type dopants, doped therein.

The isolation structure 130 can be adjacent to the active region 114. In some embodiments, the isolation structure 130 can be a shallow isolation trench, a local oxidation of silicon (LOCOS), a field oxidation region or structure (FOX), or other suitable isolation structures. In some embodiments, the isolation structure 130 can include dielectric layers 132, 134, and 136.

In some embodiments, the dielectric layer 132 can be disposed within a trench 144 defined by the substrate 110. In some embodiments, the dielectric layer 132 can be the outmost layer of the isolation structure 130. In some embodiments, the dielectric layer 132 can be conformally disposed within the trench 144 defined by the substrate 110. In some embodiments, the dielectric layer 132 can be in contact with the substrate 110. In some embodiments, the dielectric layer 132 can include a relatively thin layer of silicon dioxide. The dielectric layer 132 can also be referred to as a "liner" in this disclosure.

In some embodiments, the dielectric layer 134 can be disposed within the trench 144 defined by the substrate 110. In some embodiments, the dielectric layer 134 can be conformally disposed on the dielectric layer 132. In some embodiments, the dielectric layer 134 can be spaced apart from the substrate 110 by the dielectric layer 132. In some embodiments, the dielectric layer 134 can be spaced apart from the active region 114 by the dielectric layer 132. In some embodiments, the dielectric layer 134 can include a charge trapping material, such as silicon nitride, oxynitride, carbon nitride, or other suitable materials. In some embodiments, the dielectric layer 134 can include a relatively thin layer of silicon nitride. The dielectric layer 134 can also be referred to as a "charge trapping layer" in this disclosure.

In some embodiments, the dielectric layer 136 can be disposed within the trench 144 defined by the substrate 110. In some embodiments, the dielectric layer 136 can be spaced apart from the dielectric layer 132 by the dielectric layer 134. In some embodiments, the dielectric layer 136 can include a relatively thick layer of silicon dioxide. The dielectric layer 136 can also be referred to as an "isolation layer" in this disclosure.

In some embodiments, the isolation structure 120 can be doped with impurities 140. In some embodiments, the dielectric layer 124 of the isolation structure 120 can be doped with the impurities 140. In some embodiments, the impurities 140 can be utilized for termination of dangling bonds of the dielectric layer 124. For example, the impurities 140 can terminate the dangling bonds of silicon in silicon nitride. In some embodiments, the impurities 140 can be selected from a group consisting of fluorine (F), chlorine (CI), boron (B), hydrogen (H), and a combination thereof.

In some embodiments, the impurity concentration of the dielectric layer 124 can be greater than that of the dielectric layer 122. In some embodiments, the dielectric layer 122 can be free of the impurities 140. That is, there are no impurities in the dielectric layer 122. In some embodiments, the impurity concentration of the dielectric layer 124 can be greater than that of the dielectric layer 126. In some embodiments, the dielectric layer 126 can be free of the impurities 140. In some embodiments, the isolation structure 130 can be free of the impurities 140. In some embodiments, the dielectric layer 134 of the isolation structure 130 can be free of the impurities 140.

As shown in FIG. 1, the dielectric layer 124 can include a portion 124p1 and a portion 124p2. The portion 124p1 can be located on a sidewall 142s1 of the trench 142. The portion 124p2 can be located on a bottom 142s2 of the trench 142. In some embodiments, the impurity concentration of the portion 124p1 can be different from that of the portion 124p2. In some embodiments, the impurity concentration of the portion 124p1 can be greater than that of the portion 124p2. In some embodiments, the portion 124p2 of the dielectric layer 124 can be free of the impurities 140.

In some embodiments, the dielectric layer 124 is made of silicon nitride, and there is a lone pair of electrons of silicon and two unpaired electrons from the 2p-orbitals of nitrogen. Either a lone pair of electrons of silicon, an unpaired electron of nitrogen, or both may cause an electron to be trapped therein. When charges, such as electrons, are trapped in the dielectric layer 124, opposite charges, such as holes, may be induced and accumulate in the active region 112 of the substrate 110, resulting in hot-electron-induced punchthrough (HEIP) effect. The impurities 140 can be utilized to form a bond with silicon, terminating the dangling bond. As a result, charges, such as electrons, can be free from being trapped in the dielectric layer 124, which thereby improves the HEIP effect.

In a comparative semiconductor device, the thickness of a liner of an isolation structure is increased in order to reduce the HEIP effect. However, the aforesaid approach may adversely affect an integration of processes between the cell region and peripheral region. In another comparative semiconductor device, a polysilicon layer may be inserted between the liner and the charge trapping layer in order to reduce the HEIP effect, which may make the semiconductor device too large. In the embodiments of the disclosure, the dielectric layer 124, which is doped, can reduce the HEIP effect, while the size of the semiconductor device 100a can be kept relatively small. Furthermore, the process of doping the dielectric layer 124 with the impurities 140 can be applicable to a semiconductor device which integrates a memory device and a logic device as well as other devices.

FIG. 2 is a cross-sectional view of a semiconductor device 100b in accordance with some embodiments of the present disclosure. The semiconductor device 100b can have a structure similar to that of the semiconductor device 100a as shown in FIG. 1 except that the portion 124p2 of the isolation structure 120 of the semiconductor device 100b can be doped with the impurities 140.

In some embodiments, the impurity concentration of the portion 124p2 of the isolation structure 120 can be substantially the same as that of the portion 124p1 of the isolation structure 120. In this embodiment, one or more photolithography processes and/or etching processes can be omitted, which lowers the cost of manufacturing the semiconductor device 100b.

FIG. 3 is a cross-sectional view of a semiconductor device 100c, in accordance with some embodiments of the present disclosure. The semiconductor device 100c can have a structure similar to that of the semiconductor device 100a as shown in FIG. 1 except that the portion 124p1 of the dielectric layer 124 of the semiconductor device 100c can have an uneven impurity concentration.

As shown in FIG. 3, the portion 124p1 can include a part 124b and a part 124t. The part 124b of the portion 124p1 connects to the portion 124p2. The part 124t of the portion 124p1 is disposed over the part 124b and abuts the active region 112. In some embodiments, the impurity concentration of the part 124t can be different from that of the part 124b. In some embodiments, the impurity concentration of the part 124t can be greater than that of the part 124b. In some embodiments, the part 124b of the isolation structure 120 can be free of the impurities 140, which thus reduces the change of electrical parameters of the semiconductor device 100c.

FIG. 4 is a cross-sectional view of a semiconductor device 100d in accordance with some embodiments of the present disclosure. The semiconductor device 100d can have a structure similar to that of the semiconductor device 100a as shown in FIG. 1 except that the isolation structure 130 is doped with the impurities 140.

In some embodiments, the dielectric layer 134 of the isolation structure 130 can be doped with the impurities 140. In some embodiments, the dielectric layer 132 of the isolation structure 130 can be free of the impurities 140. In some embodiments, the dielectric layer 136 of the isolation structure 130 can be free of the impurities 140. The dielectric layer 134 can include a portion 134p1 and a portion 134p2. The portion 134p1 can be located on a sidewall 144s1 of the trench 144. The portion 134p2 can be located on a bottom 144s2 of the trench 144. In some embodiments, the impurity concentration of the portion 134p1 can be different from that of the portion 134p2. In some embodiments, the impurity concentration of the portion 134p1 can be greater than that of the portion 134p2. In some embodiments, the portion 134p2 of the dielectric layer 134 can be free of the impurities 140.

The portion 134p1 of the dielectric layer 134 can include a part 134b and a part 134t over the part 134b. In some embodiments, the impurity concentration of the part 134t of the portion 134p1 can be the same as that of the part 134b of the portion 134p1. In other embodiments, the impurity concentration of the part 134t of the portion 134p1 can be different from that of the part 134b of the portion 134p1. In other embodiments, the impurity concentration of the part 134t of the portion 134p1 can be greater than that of the part 134b of the portion 134p1. In other embodiments, the part 134b of the portion 134p1 can be free of the impurities 140.

In this embodiment, the processes of doping the isolation structures 120 and 130 with the impurities 140 can be performed by the same step, which reduces the cost of manufacturing the semiconductor device 100d.

FIG. 5 is a cross-sectional view of a semiconductor device 100e, in accordance with some embodiments of the present disclosure. The semiconductor device 100e can have a structure similar to that of the semiconductor device 100a as shown in FIG. 1 except that the isolation structure 130 of the semiconductor device 100a can be replaced with the isolation structure 130'.

In some embodiments, the structure and/or composition of the isolation structure 120 can be different from the isolation structure 130'. In some embodiments, the isolation structure 130' can be a single layer structure. In some embodiments, the isolation structure 130' can be made of silicon oxide, which reduces the HEIP effect of the semiconductor device 100e.

FIG. 6 is a cross-sectional view of a semiconductor device 100f, in accordance with some embodiments of the present disclosure. The semiconductor device 100f can have a structure similar to that of the semiconductor device 100a as shown in FIG. 1 except that the dielectric layer 122 of the isolation structure 120 can be doped with the impurities 140.

As shown in FIG. 6, the dielectric layer 122 can include a portion 122p1 and a portion 122p2. The portion 122p1 can be located on the sidewall 142s1 of the trench 142. The portion 122p2 can be located on the bottom 142s2 of the trench 142. In some embodiments, the impurity concentration of the portion 122p1 can be different from that of the portion 122p2. In some embodiments, the impurity concentration of the portion 122p1 can be greater than that of the portion 122p2. In some embodiments, the portion 122p2 of the dielectric layer 122 can be free of the impurities 140.

In some embodiments, the portion 122p1 can include a part 122b and a part 122t. The part 122b of the portion 122p1 connects to the portion 122p2. The part 122t of the portion 122p1 is disposed over the part 122b and abuts the active region 112. In some embodiments, the impurity concentration of the part 122t can be different from that of the part 122b. In some embodiments, the impurity concentration of the part 122t can be greater than that of the part 122b. In some embodiments, the part 122b of the dielectric layer 122 can be free of the impurities 140.

FIG. 7 is a cross-sectional view of a semiconductor device 100g, in accordance with some embodiments of the present disclosure. The semiconductor device 100g can have a structure similar to that of the semiconductor device 100a as shown in FIG. 1 except that the active region 112 can be doped with the impurities 140.

In some embodiments, the top part of the active region 112 can be doped with the impurities 140. In some embodiments, the bottom part of the active region 112 can be free of the impurities 140.

FIG. 8 is a flowchart illustrating a method 200 for manufacturing a semiconductor device, in accordance with various aspects of the present disclosure.

The method 200 begins with operation 202, in which a substrate can be provided. The semiconductor device can include a cell region and a peripheral region. The semiconductor device can include a first active region in the cell region and a second active region in the peripheral region.

The method 200 continues with operation 204, in which a first trench and a second trench can be formed. The first trench can be formed in the cell region. The second trench can be formed in the peripheral region.

The method 200 continues with operation 206, in which a first liner and a second liner can be formed. The first liner can be formed within the first trench. The second liner can be formed with the second trench.

The method 200 continues with operation 208, in which a first charge trapping layer and a second charge trapping layer can be formed. The first charge trapping layer can be conformally formed on the first liner. The second charge trapping layer can be conformally formed on the second liner.

The method 200 continues with operation 210, in which a protective layer can be formed. The protective layer can be formed in the cell region and in the peripheral region. The protective layer can cover a first active region. The protective layer can cover the first charge trapping layer. The protective layer can fill the first trench. The protective layer can cover a second active region. The protective layer can cover the second charge trapping layer. The protective layer can fill the second trench.

The method 200 continues with operation 212, in which a portion of the protective layer in the cell region can be removed. A portion of the protective layer within the first trench can be removed. A portion of the first charge trapping layer can be exposed from the protective layer.

The method 200 continues with operation 214, in which a doping process can be performed. The first charge trapping layer can be doped with impurities. The impurity can be utilized to terminate the dangling bond in the charge trapping layer. The impurity can be doped into the sidewall of the first charge trapping layer. The bottom of the first charge trapping layer can be free of the impurities. The first liner can be free of the impurities. The second charge trapping layer can be free of the impurities. The second liner can be free of the impurities.

The method 200 continues with operation 216, in which the remaining protective layer can be removed. A first isolation layer and a second isolation layer can be formed. The first isolation layer can be formed on the first charge trapping layer, thereby forming a first isolation structure. The second isolation layer can be formed on the second charge trapping layer, thereby forming a second isolation structure. As a result, a semiconductor device can be produced.

In this embodiment, the charge trapping layer can be doped with the impurities. The impurities can be utilized to terminate the dangling bond of the first charge trapping layer, which thereby improves the HEIP effect.

The method 200 is merely an example, and is not intended to limit the present disclosure beyond what is explicitly recited in the claims. Additional operations can be provided before, during, or after each operation of the method 200, and some operations described can be replaced, eliminated, or reordered for additional embodiments of the method. In some embodiments, the method 200 can include further operations not depicted in FIG. 8. In some embodiments, the method 200 can include one or more operations depicted in FIG. 8.

FIG. 9A, FIG. 9B, FIG. 9C, FIG. 9D, FIG. 9E, FIG. 9F, FIG. 9G, and FIG. 9H illustrate various stages of manufacturing a semiconductor device, in accordance with some embodiments of the present disclosure.

Referring to FIG. 9A, a substrate 110 can be provided. An active region 112 can be formed in a cell region 102 of the substrate 110. An active region 114 can be formed in a peripheral region 104 of the substrate 110.

Referring to FIG. 9B, a trench 142 and a trench 144 can be formed. In some embodiments, an etching process can be performed to remove a portion of the substrate 110. The trench 142 can be located in the cell region 102. The trench 144 can be located in the peripheral region 104.

Figure 9C:
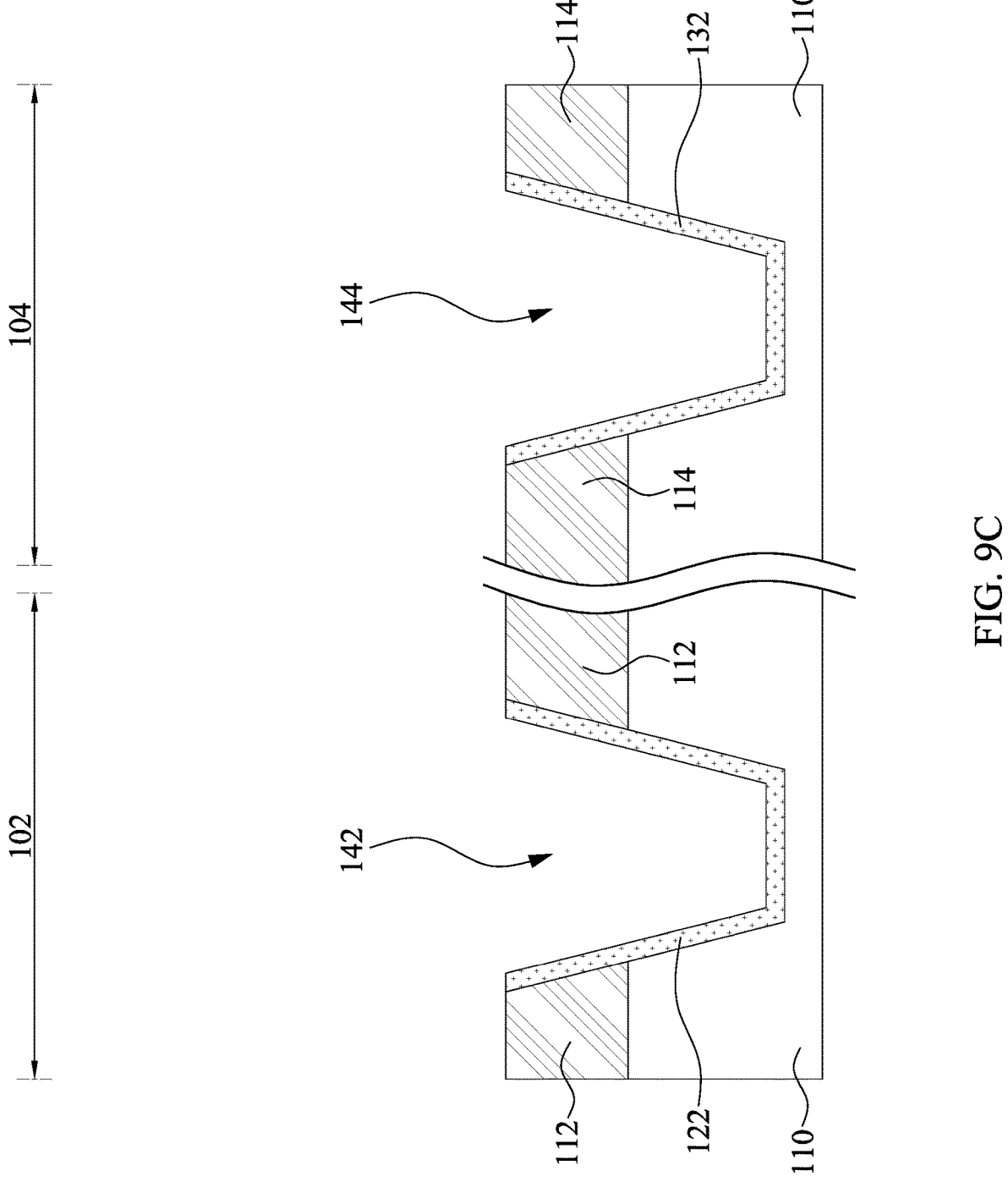
FIG. 9C illustrates various stages of manufacturing a semiconductor device, in accordance with some embodiments of the present disclosure.

Referring to FIG. 9C, a dielectric layer 122 and a dielectric layer 132 can be formed. In some embodiments, the dielectric layer 122 can be conformally formed within the trench 142 defined by the substrate 110. In some embodiments, the dielectric layer 132 can be conformally formed within the trench 144 defined by the substrate 110. In some embodiments, each of the dielectric layers 122 and 132 can be formed by thermal oxidation of the substrate 110. In some embodiments, each of the dielectric layers 122 and 132 can be formed by chemical vapor deposition (CVD), plasma enhanced CVE (PECVD), flowable CVD (FCVD), or other suitable process. In some embodiments, each of the dielectric layers 122 and 132 can include silicon oxide.

Figure 9D:
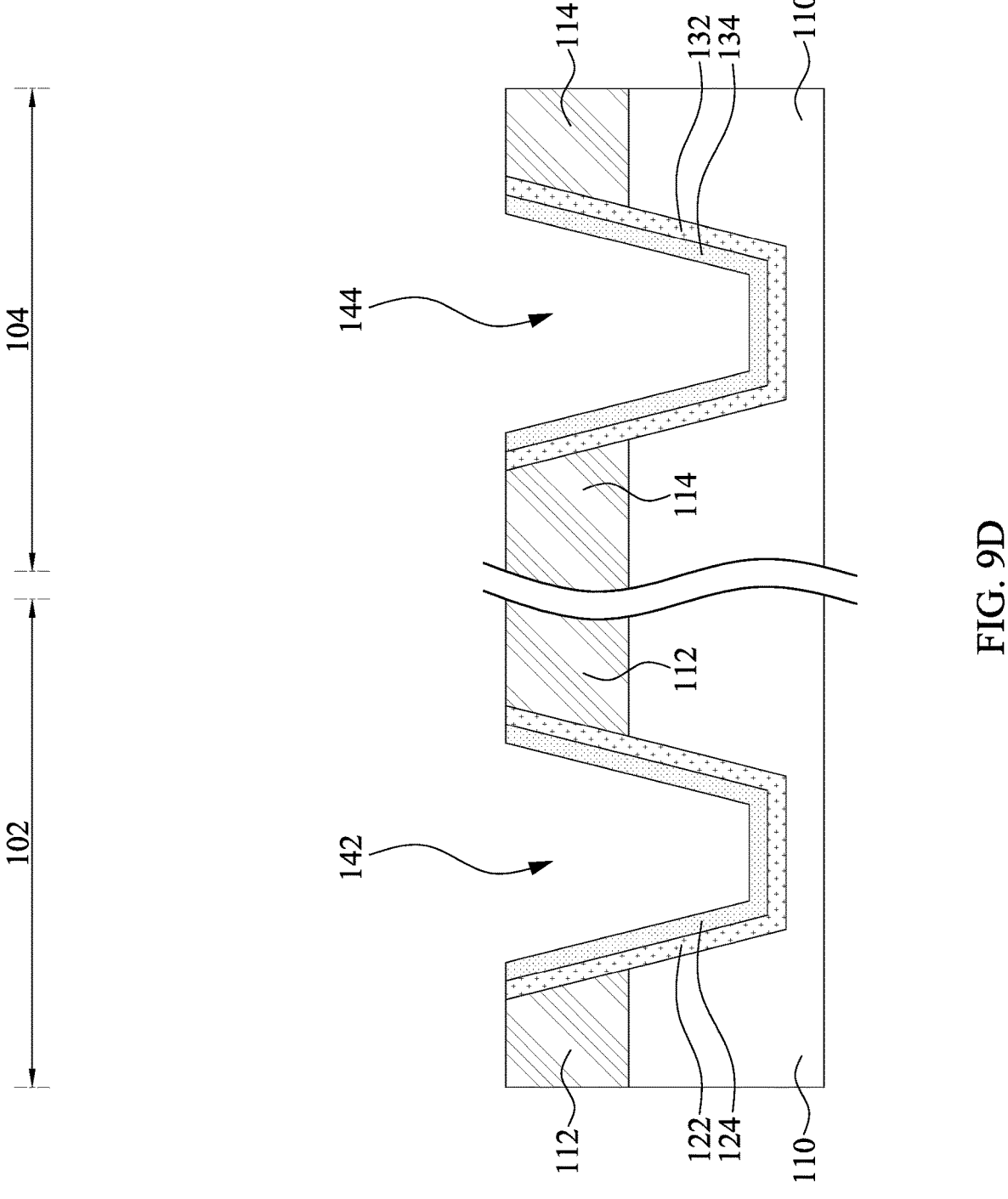
FIG. 9D illustrates various stages of manufacturing a semiconductor device, in accordance with some embodiments of the present disclosure.

Referring to FIG. 9D, a dielectric layer 124 and a dielectric layer 126 can be formed. In some embodiments, the dielectric layer 124 can be conformally formed on the dielectric layer 122. In some embodiments, the dielectric layer 134 can be conformally formed on the dielectric layer 132. In some embodiments, each of the dielectric layers 124 and 134 can be formed by CVD, ALD, PECVD, FCVD, or other suitable process. In some embodiments, each of the dielectric layers 124 and 134 can include nitride containing compound, such as silicon nitride, oxynitride, carbon nitride, or other suitable materials.

Figure 9E:
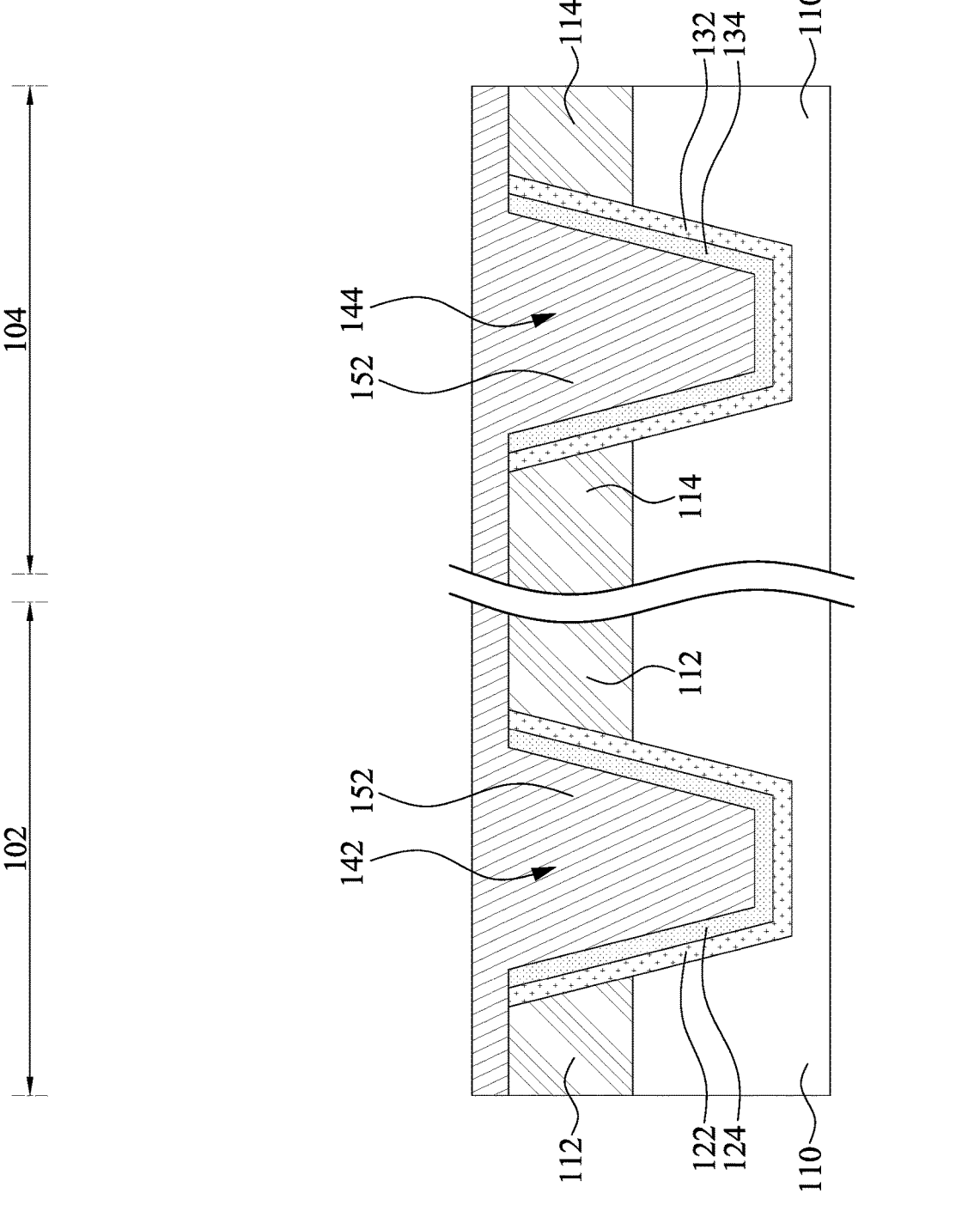
FIG. 9E illustrates various stages of manufacturing a semiconductor device, in accordance with some embodiments of the present disclosure.

Referring to FIG. 9E, a protective layer 152 can be formed. In some embodiments, the protective layer 152 can fill the trench 142 and the trench 144. The protective layer 152 can cover the active region 112. The protective layer 152 can cover the active region 114. In some embodiments, the protective layer 152 can cover the dielectric layer 124. In some embodiments, the protective layer 152 can cover the dielectric layer 134. In some embodiments, the protective layer 152 can include photosensitive material, such as a negative-tone photoresist or a positive-tone photoresist. The protective layer 152 can be formed by, for example, a spin coating process.

Figure 9F:
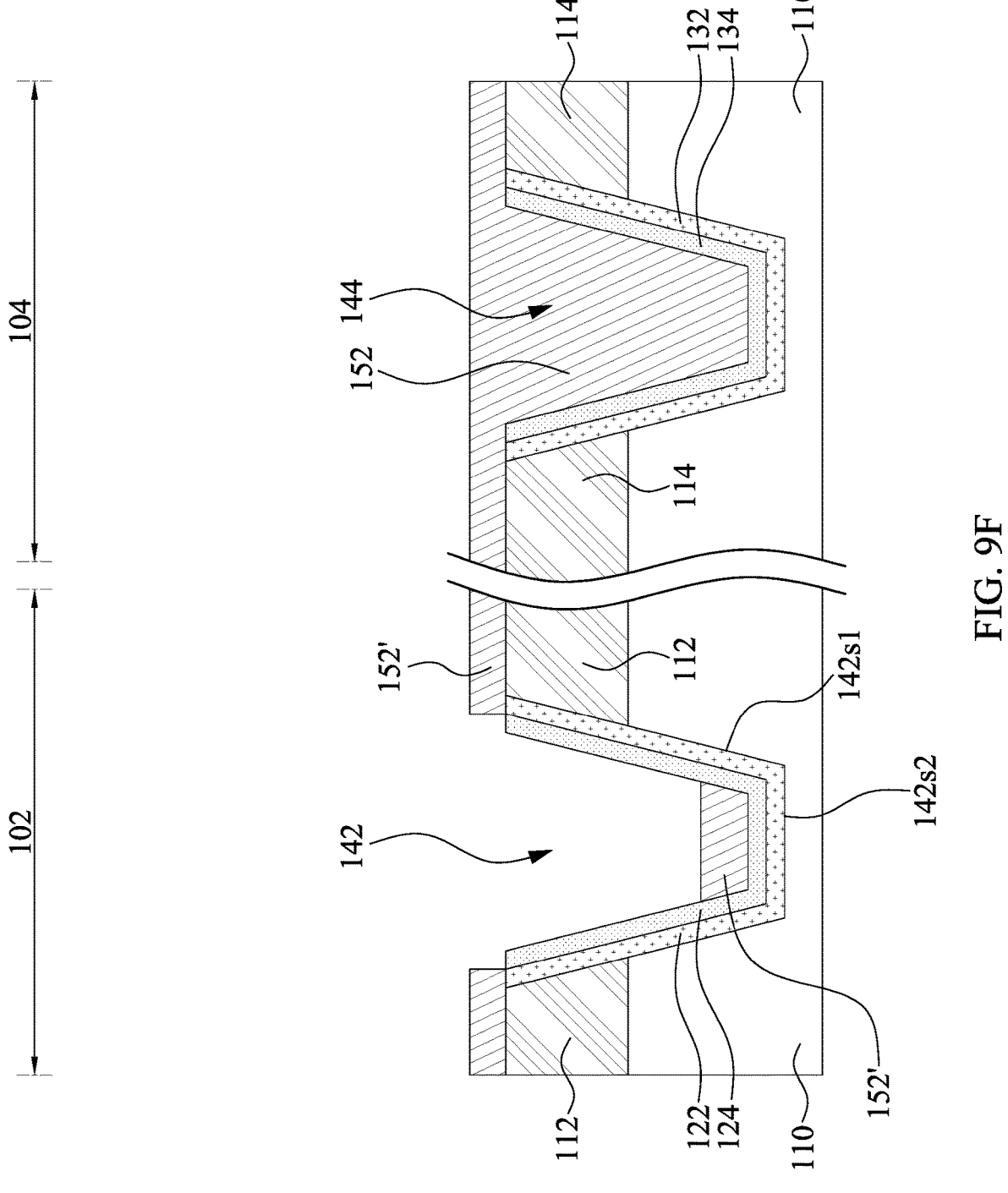
FIG. 9F illustrates various stages of manufacturing a semiconductor device, in accordance with some embodiments of the present disclosure.

Referring to FIG. 9F, a portion of the protective layer 152 can be removed. In some embodiments, a portion of the protective layer 152 in the cell region 102 can be removed. In some embodiments, the protective layer 152' can remain on the bottom 142s2 of the trench 142. In some embodiments, the sidewall 142s1 of the trench 142 can be exposed from the protective layer 152'. In some embodiments, a portion of the dielectric layer 124 can be exposed from the protective layer 152'.

Figure 9G:
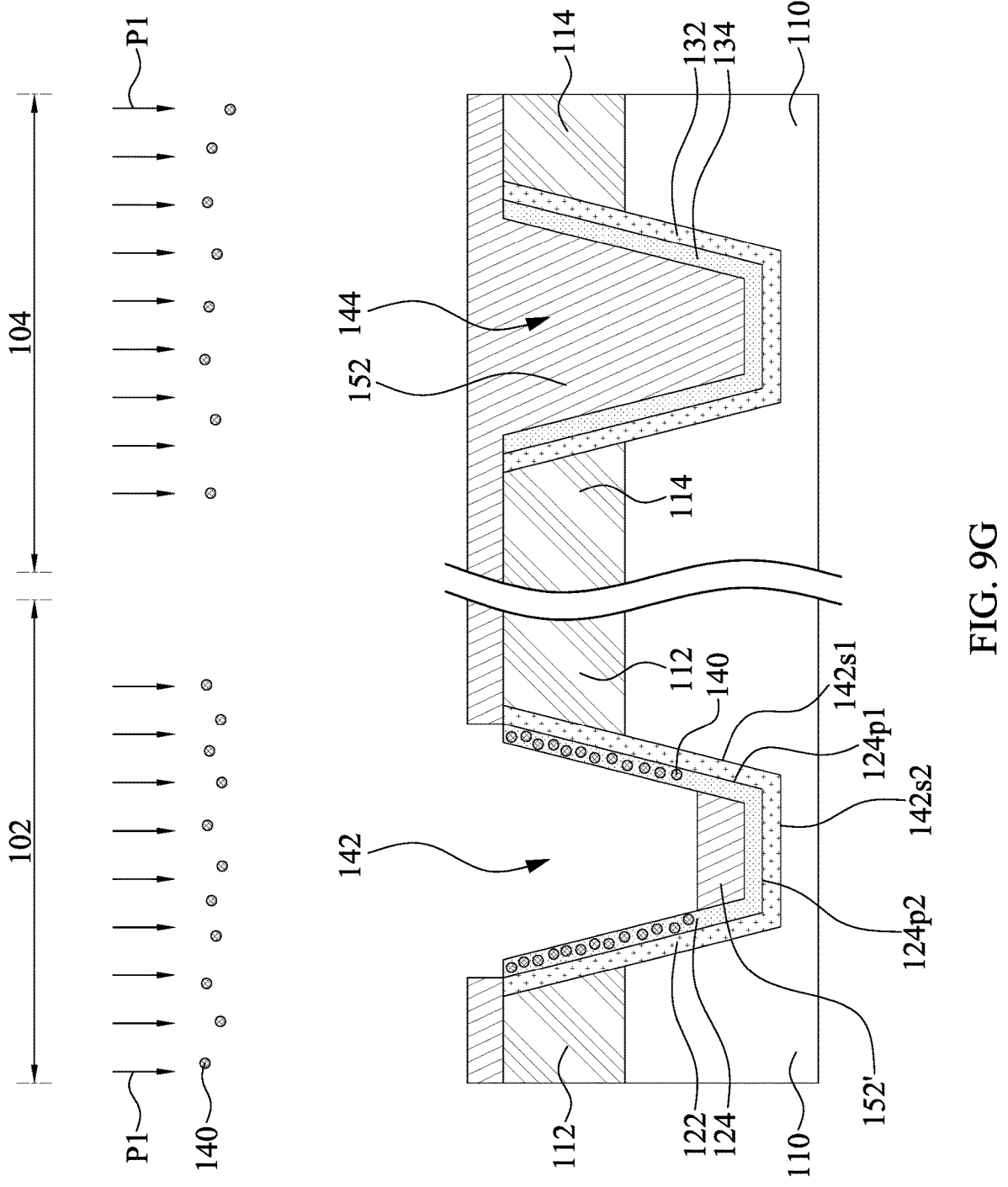
FIG. 9G illustrates various stages of manufacturing a semiconductor device, in accordance with some embodiments of the present disclosure.

Referring to FIG. 9G, a doping process P1 can be performed. The dielectric layer 124 can be doped with the impurities 140. In some embodiments, the impurities 140 can be selected from a group consisting of fluorine, chlorine, boron, hydrogen, and a combination thereof. In some embodiments, during the doping process P1, the portion 124p1 of the dielectric layer 124 can be doped with the impurities 140. In some embodiments, during the doping process P1, the portion 124p2 of the dielectric layer 124 can be protected from being doped with the impurities 140 by the protective layer 152'. In some embodiments, during the doping process P1, the dielectric layer 132 can be protected from being doped with the impurities 140 by the protective layer 152.

Referring to FIG. 9H, the protective layer 152 and protective layer 152' can be removed. A dielectric layer 126 can be formed to produce the isolation structure 120. A dielectric layer 136 can be formed to produce the isolation structure 130. The dielectric layers 126 and 136 can be formed by, for example, CVD, PECVD, FCVD, or other suitable process. A dielectric layer 136 can be formed to form the isolation structure 130. As a result, the semiconductor device 100a can be produced.

In this embodiment, the dielectric layer 124 can be doped with the impurities 140. The impurities 140 can be utilized to terminate the dangling bond of the dielectric layer 124, which thereby improves the HEIP effect.

FIG. 10 is a flowchart illustrating a method 300 for manufacturing a semiconductor device, in accordance with various aspects of the present disclosure. The initial operation of operation 302 is the same as, or similar to, operations 202 through 210 illustrated in FIG. 8. Operation 302 depicts operation subsequent to that depicted in operation 210.

The method 300 includes operation 302, in which the protective layer in the cell region can be removed. The portion of the first charge trapping layer can be exposed from the protective layer. The bottom of the first charge trapping layer can be exposed by the protective layer.

The method 300 continues with operation 304, in which a medium layer can be formed. The medium layer can cover the first charge trapping layer. The medium layer can conformally formed on the first charge trapping layer. The medium layer can cover the protective layer in the peripheral region. The medium layer can include a semiconductor material, such as polysilicon.

The method 300 continues with operation 306, in which a doping process can be performed. The medium layer can be doped with impurities.

The method 300 continues with operation 308, in which a thermal process can be performed. The impurity can be diffused into the first charge trapping layer. The impurity can be diffused into the sidewall of the first charge trapping layer. The impurity can be diffused into the bottom of the first charge trapping layer. The second charge trapping layer can be protected from the diffusion of the impurities by the protective layer.

The method 300 continues with operation 310, in which the medium layer can be removed. The remaining protective layer can be removed, exposing the first charge trapping layer and the second charge trapping layer.

The method 300 continues with operation 312, in which a first isolation layer and a second isolation layer can be formed. The first isolation layer can be formed on the first charge trapping layer, thereby forming a first isolation structure. The second isolation layer can be formed on the second charge trapping layer, thereby forming a second isolation structure. As a result, a semiconductor device can be produced.

In this embodiment, the impurities can be diffused to the first charge trapping layer through a medium layer, which can include a polysilicon layer. The formation of the medium layer can be integrated with other devices, which allows greater flexibility of a manufacturing process.

The method 300 is merely an example, and is not intended to limit the present disclosure beyond what is explicitly recited in the claims. Additional operations can be provided before, during, or after each operation of the method 300, and some operations described can be replaced, eliminated, or reordered for additional embodiments of the method. In some embodiments, the method 300 can include further operations not depicted in FIG. 10. In some embodiments, the method 300 can include one or more operations depicted in FIG. 10.

FIG. 11A, FIG. 11B, FIG. 11C, FIG. 11D, FIG. 11E, and FIG. 11F illustrate various stages of manufacturing a semiconductor device, in accordance with some embodiments of the present disclosure.

Figure 11A:
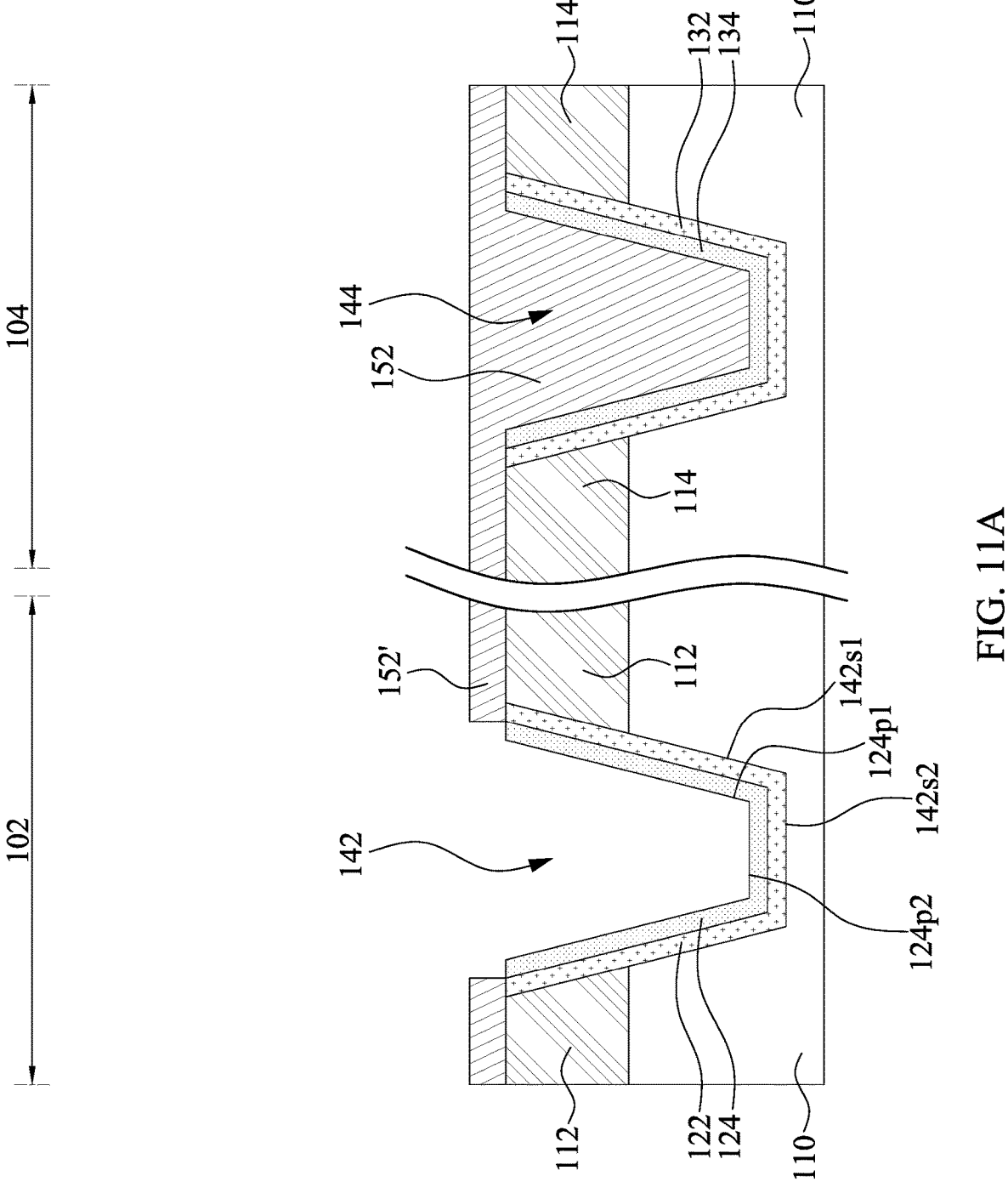
FIG. 11A illustrates various stages of manufacturing a semiconductor device, in accordance with some embodiments of the present disclosure.

The initial stage of the illustrated process before FIG. 11A is the same as, or similar to, the stage illustrated in FIG. 9A through FIG. 9E. FIG. 11A depicts a stage subsequent to that depicted in FIG. 9E.

Referring to FIG. 11A, the protective layer 152 in the trench 142 can be removed. The protective layer 152' can remain over the dielectric layer 122 and the substrate 110. In some embodiments, the portion 124p1 can be exposed from the protective layer 152. In some embodiments, the portion 124p2 can be exposed from the protective layer 152. In some embodiments, the protective layer 152' can remain on the dielectric layer 122 and on the substrate 110.

Figure 11B:
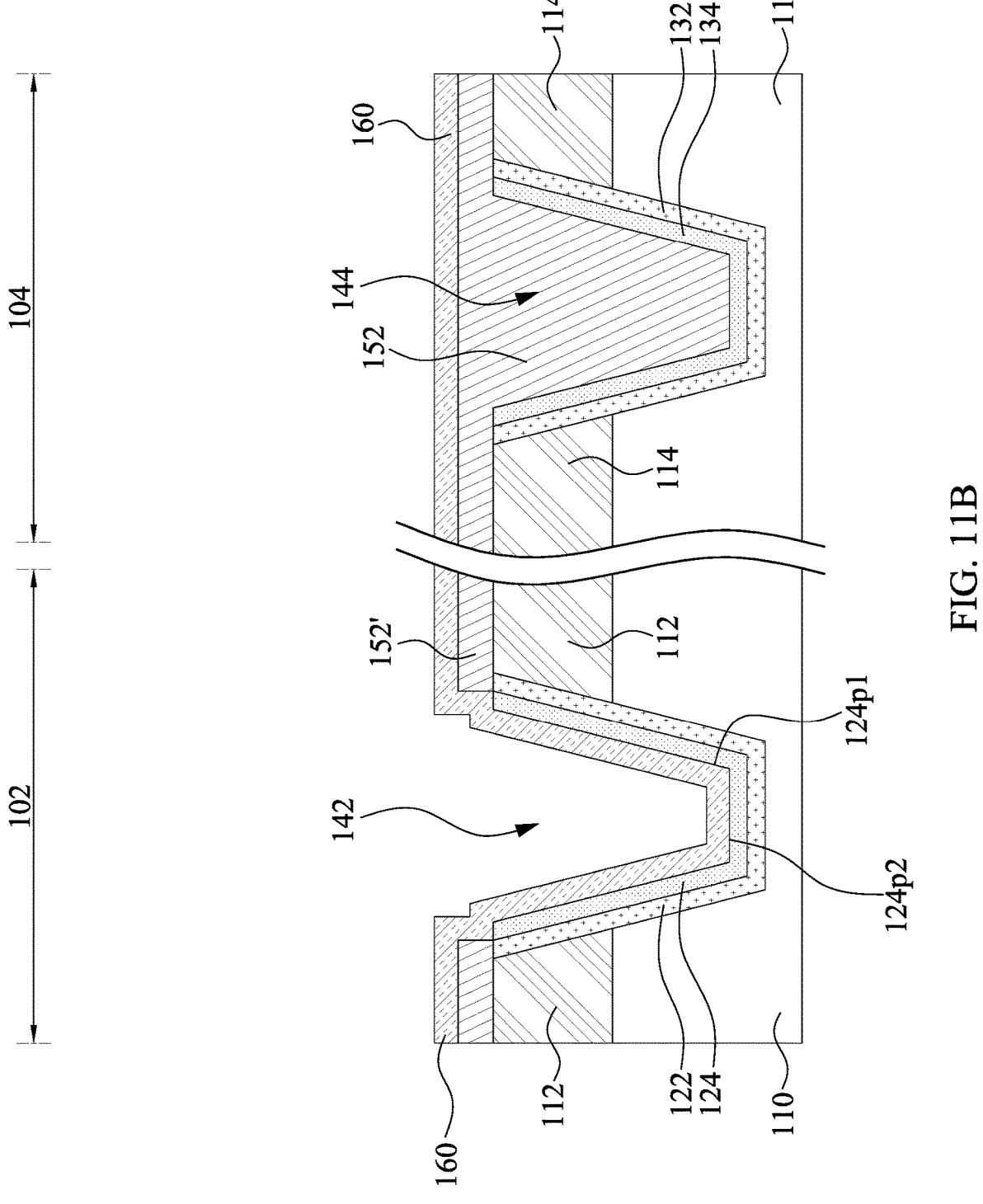
FIG. 11B illustrates various stages of manufacturing a semiconductor device, in accordance with some embodiments of the present disclosure.

Referring to FIG. 11B, a medium layer 160 can be formed. In some embodiments, the medium layer 160 can be conformally formed on the dielectric layer 124. In some embodiments, the medium layer 160 can be conformally formed on the protective layer 150'. In some embodiments, the medium layer 160 can be formed on the portion 124p1 of the dielectric layer 124. In some embodiments, the medium layer 160 can be in contact with the portion 124p1 of the dielectric layer 124. In some embodiments, the medium layer 160 can be formed on the portion 124p2 of the dielectric layer 124. In some embodiments, the medium layer 160 can be in contact with the portion 124p2 of the dielectric layer 124. In some embodiments, the medium layer 160 can cover the protective layer 152 in the peripheral region 104. In some embodiments, the dielectric layer 134 can be spaced apart from the medium layer 160 by the protective layer 152. The medium layer 160 can function as a medium through which impurities pass into the dielectric layer 124. In some embodiments, the medium layer 160 can include a semiconductor material, such as a polysilicon or other suitable materials. The medium layer 160 can be formed by CVD, PECVD, FCVD, or other suitable process.

Figure 11C:
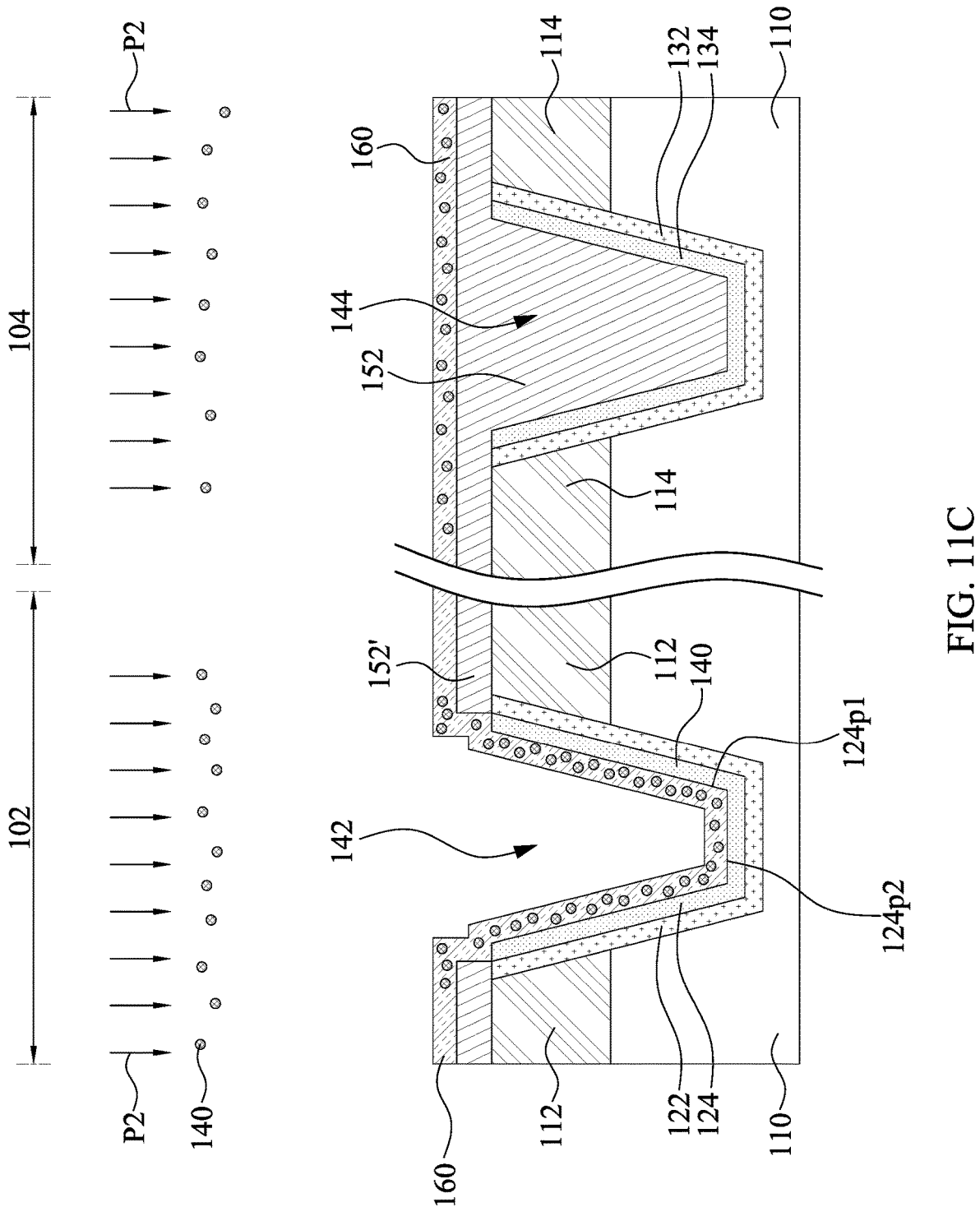
FIG. 11C illustrates various stages of manufacturing a semiconductor device, in accordance with some embodiments of the present disclosure.

Referring to FIG. 11C, a doping process P2 can be performed. The medium layer 160 can be doped with the impurities 140.

Figure 11D:
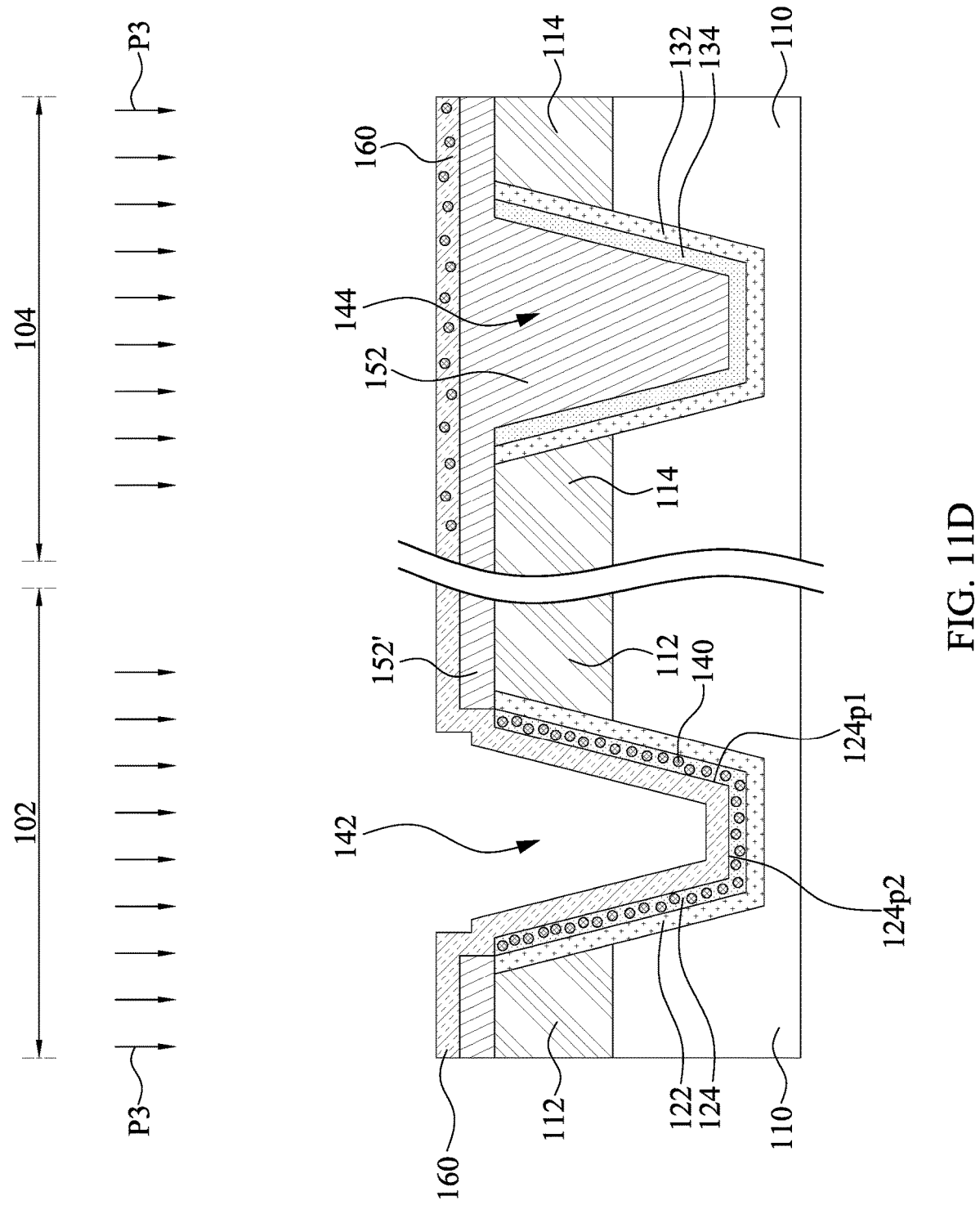
FIG. 11D illustrates various stages of manufacturing a semiconductor device, in accordance with some embodiments of the present disclosure.

Referring to FIG. 11D, a thermal process P3 can be performed. In some embodiments, the impurities 140 can be diffused into the dielectric layer 124 from the medium layer 160. The temperature of the thermal process P3 can range from about 200° C. to about 700° C., such as 200° C., 300° C., 400° C., 500° C., 600° C., or 700° C. The dielectric layer 134 can be protected from the diffusion of the impurities 140 by the protective layer 152. In some embodiments, the impurities 140 can be diffused into the portion 124p1 of the dielectric layer 124. In some embodiments, the impurities 140 can be diffused into the portion 124p2 of the dielectric layer 124. In some embodiments, the dielectric layer 134 can be protected from the diffusion of the impurities 140 by the protective layer 152.

Figure 11E:
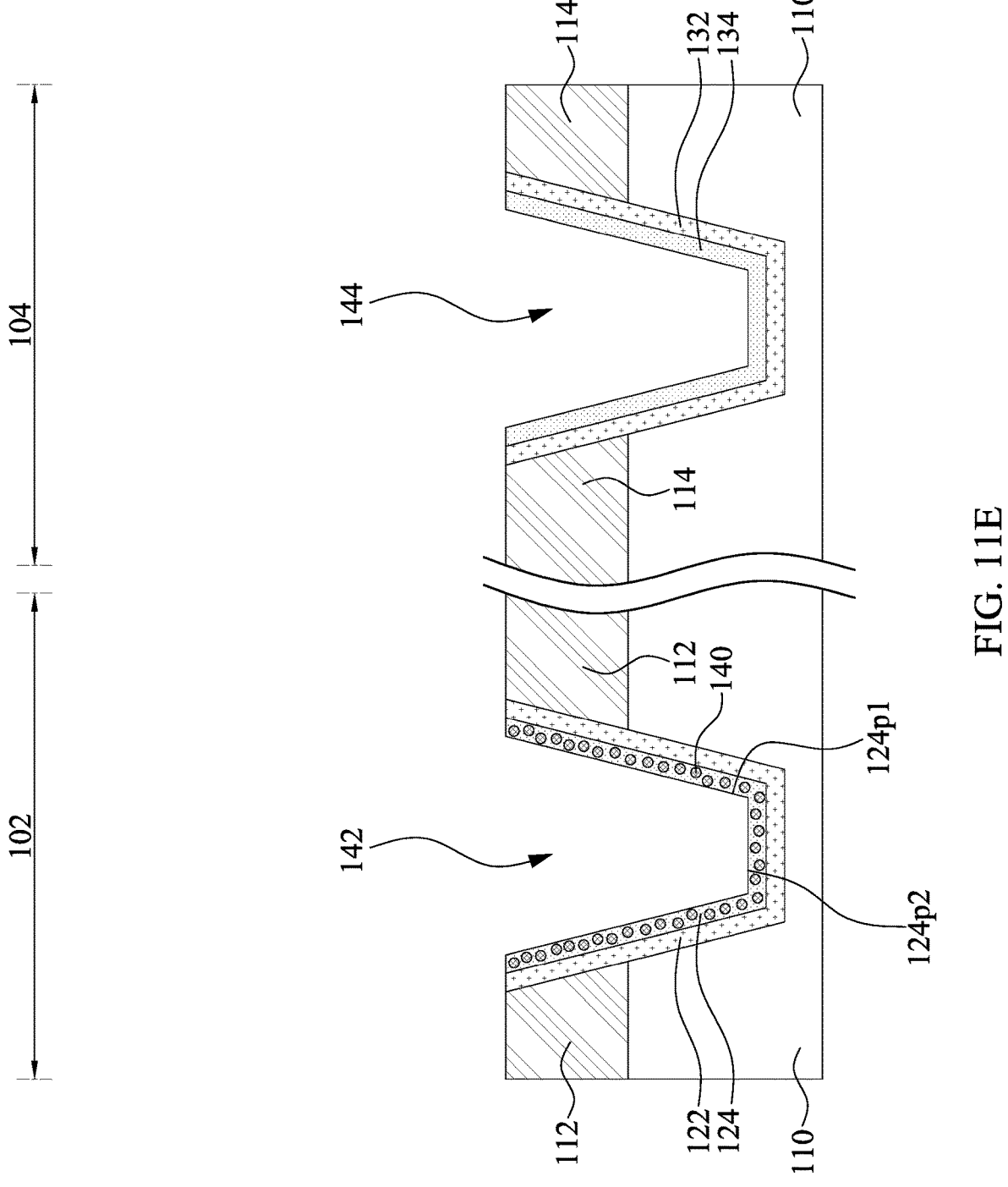
FIG. 11E illustrates various stages of manufacturing a semiconductor device, in accordance with some embodiments of the present disclosure.

Referring to FIG. 11E, the medium layer 160 can be removed. The protective layers 152 and 152' can be removed, exposing the dielectric layers 124 and 134. The medium layer 160 can be removed by an etching process, such as wet etching. The etchant can include, for example, tetramethyl ammonium hydroxide (TMAH) or other suitable etchants.

Referring to FIG. 11F, a dielectric layer 126 can be formed to fill the trench 142, forming the isolation structure 120. A dielectric layer 136 can be formed to fill the trench 144, forming the isolation structure 130. The dielectric layers 126 and 136 can be formed by CVD, ALD, PECVD, FCVD, or other suitable process. As a result, the semiconductor device 100b can be produced.

In this embodiment, the impurities 140 can be diffused to the dielectric layer 124 through the medium layer 160. The formation of the medium layer 160 can be integrated with other devices, which improves the flexibility of a manufacturing process.

One aspect of the present disclosure provides a semiconductor device. The semiconductor device includes a substrate and a first isolation structure. The substrate has a cell region and a peripheral region. The first isolation structure is disposed in the cell region of the substrate. The first isolation structure includes a first dielectric layer and a second dielectric layer. The second dielectric layer is spaced apart from the substrate by the first dielectric layer. The second dielectric layer is doped with an impurity.

Another aspect of the present disclosure provides a semiconductor device. The semiconductor device includes a substrate and a shallow trench isolation (STI). The substrate has an active region. The STI is adjacent to the active region of the substrate. The STI includes a charge trapping layer and a liner. The liner is disposed between the charge trapping layer and the active region of the substrate. The charge trapping layer is doped with an impurity.

Another aspect of the present disclosure provides a method for manufacturing a semiconductor device. The method includes: providing a substrate comprising a cell region and a peripheral region; forming a first isolation structure in the cell region and a second isolation structure in the peripheral region; and doping the first isolation structure with an impurity.

The embodiments of the present disclosure disclose a semiconductor device including an isolation structure. The isolation structure can include a charge trapping layer, such as silicon nitride. The lone pair of electrons of silicon may trap electrons, inducing the HEIP effect. In this embodiment, the charge trapping layer can be doped with impurities. The impurities can be utilized to terminate the dangling bond of the first charge trapping layer, which improves the HEIP effect.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
   a substrate having an active region; and
   a shallow trench isolation (STI) adjacent to the active region of the substrate, wherein the STI comprises:
   a charge trapping layer; and
   a liner disposed between the charge trapping layer and the active region of the substrate,
   wherein the charge trapping layer is doped with an impurity;
   wherein the charge trapping layer has a first portion and a second portion, the first portion and the second portion of the charge trapping layer collectively define a trench, and the second portion of the charge trapping layer defines a bottom of the trench, and wherein an impurity concentration of the first portion is greater than an impurity concentration of the second portion of the charge trapping layer.

2. The semiconductor device of claim 1, wherein the impurity is selected from a group consisting of fluorine, chlorine, boron, hydrogen, and a combination thereof.

3. The semiconductor device of claim 1, wherein the second portion of the charge trapping layer is free of the impurity.

4. The semiconductor device of claim 1, wherein the first portion of the charge trapping layer has a top part adjacent to the active region of the substrate and a bottom part adjacent to the second portion of the charge trapping layer, and an impurity concentration of the top part of the charge trapping layer is different from an impurity concentration of the bottom part of the charge trapping layer.

5. The semiconductor device of claim 4, wherein the impurity concentration of the top part of the charge trapping layer is greater than the impurity concentration of the bottom part of the charge trapping layer.

6. The semiconductor device of claim 5, wherein the bottom part of the charge trapping layer is free of the impurity.

7. The semiconductor device of claim 1, wherein the liner is doped with the impurity.

8. The semiconductor device of claim 1, wherein the liner is free of the impurity.

* * * * *